United States Patent
Salowe

(10) Patent No.: US 9,213,793 B1
(45) Date of Patent: Dec. 15, 2015

(54) METHODS, SYSTEMS, AND ARTICLES OF MANUFACTURE FOR IMPLEMENTING ELECTRONIC DESIGNS USING FLEXIBLE ROUTING TRACKS

(71) Applicant: Cadence Design Systems, Inc., San Jose, CA (US)

(72) Inventor: Jeffrey S. Salowe, Los Gatos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/044,836

(22) Filed: Oct. 2, 2013

(51) Int. Cl.
*G06F 17/50* (2006.01)

(52) U.S. Cl.
CPC .................. *G06F 17/5077* (2013.01)

(58) Field of Classification Search
CPC .......... G06F 17/5077; G06F 17/5068; G06F 17/5022; G06F 17/5054; G06F 17/509; G06F 17/5045; G06F 17/5031
USPC .................. 716/126, 129, 130, 131
See application file for complete search history.

(56) References Cited

U.S. PATENT DOCUMENTS

| | | |
|---|---|---|
| 2,915,831 A | 12/1959 | Parker |
| 4,484,292 A | 11/1984 | Hong et al. |
| 4,811,237 A | 3/1989 | Putatunda et al. |
| 5,535,134 A | 7/1996 | Cohn et al. |
| 5,644,500 A | 7/1997 | Miura et al. |
| 5,729,469 A | 3/1998 | Kawakami |
| 5,770,481 A | 6/1998 | Fujii |
| 5,781,446 A | 7/1998 | Wu |
| 5,801,959 A | 9/1998 | Ding et al. |
| 6,011,912 A | 1/2000 | Yui et al. |
| 6,298,468 B1 | 10/2001 | Zhen |
| 6,324,675 B1 | 11/2001 | Dutta et al. |
| 6,349,403 B1 | 2/2002 | Dutta et al. |
| 6,370,673 B1 | 4/2002 | Hill |
| 6,407,434 B1 | 6/2002 | Rostoker et al. |
| 6,490,713 B2 | 12/2002 | Matsumoto |
| 6,505,333 B1 * | 1/2003 | Tanaka .......................... 716/111 |
| 6,543,041 B1 | 4/2003 | Scheffer et al. |

(Continued)

OTHER PUBLICATIONS

Li et al., "NEMO: A New Implicit-Connection Graph-Based Gridless Router With Multilayer Planes and Pseudo Tile Propagation,""IEEE Trans. on CAD of ICs & Systems, vol. 26, No. 4 Apr. 2007, pp. 705-718."

(Continued)

*Primary Examiner* — Vuthe Siek
(74) *Attorney, Agent, or Firm* — Vista IP Law Group, LLP

(57) ABSTRACT

One aspect interconnects two regions subject to different rules and using transition rule(s) in a transition region or cost mechanism(s), where these rules may include soft rule(s), hard rule(s), or combinations thereof. These two regions may reside on the same routing layer or on different routing layers. This aspect allows physical design tools to transition across gridded, gridless, tracked, or trackless regions subject to different rules on the same or different layers. Another aspect interconnects an object subject to the first rule(s) and the second rule(s), while the object satisfies or violates the first rule(s). These aspects use spacetile(s) on a spacetile layer as search probe(s) to find viable implementation solutions, although the spacetile(s) and hence the search probe may violate one or more rules. A spacetile layer may be identified or created for each rule and may be associated with relevant features subject to relevant rule(s).

30 Claims, 16 Drawing Sheets

(56) References Cited

U.S. PATENT DOCUMENTS

| | | | |
|---|---|---|---|
| 6,557,145 B2 | 4/2003 | Boyle et al. | |
| 6,557,153 B1 | 4/2003 | Dahl et al. | |
| 6,609,237 B1 | 8/2003 | Hamawaki et al. | |
| 6,763,512 B2 | 7/2004 | Xing | |
| 6,769,105 B1 | 7/2004 | Teig et al. | |
| 6,813,755 B2* | 11/2004 | Xing | 716/129 |
| 6,851,100 B1 | 2/2005 | You et al. | |
| 6,892,371 B1 | 5/2005 | Teig et al. | |
| 6,931,616 B2 | 8/2005 | Teig et al. | |
| 6,938,226 B2 | 8/2005 | Nguyen et al. | |
| 6,938,234 B1 | 8/2005 | Teig et al. | |
| 6,957,407 B2 | 10/2005 | Suto | |
| 6,957,411 B1 | 10/2005 | Teig et al. | |
| 6,981,235 B1 | 12/2005 | Salowe et al. | |
| 6,996,512 B2 | 2/2006 | Alpert et al. | |
| 7,016,794 B2 | 3/2006 | Schultz | |
| 7,039,881 B2 | 5/2006 | Regan | |
| 7,051,313 B1 | 5/2006 | Betz et al. | |
| 7,076,750 B1 | 7/2006 | Lukanc | |
| 7,089,526 B1 | 8/2006 | Salowe et al. | |
| 7,096,445 B1 | 8/2006 | Pucci et al. | |
| 7,100,128 B1 | 8/2006 | Nequist et al. | |
| 7,107,564 B1 | 9/2006 | Teig et al. | |
| 7,117,468 B1 | 10/2006 | Teig et al. | |
| 7,139,993 B2 | 11/2006 | Proebsting et al. | |
| 7,222,322 B1* | 5/2007 | Chyan et al. | 716/122 |
| 7,257,797 B1 | 8/2007 | Waller et al. | |
| 7,363,607 B2 | 4/2008 | Birch et al. | |
| 7,516,433 B1 | 4/2009 | Pucci et al. | |
| 7,523,430 B1 | 4/2009 | Patel | |
| 7,594,214 B1 | 9/2009 | Salowe et al. | |
| 7,640,520 B2 | 12/2009 | Wang et al. | |
| 7,657,852 B2 | 2/2010 | Waller | |
| 7,694,261 B1 | 4/2010 | Chyan et al. | |
| 7,735,043 B2 | 6/2010 | Ueda | |
| 7,752,590 B1 | 7/2010 | Chyan et al. | |
| 7,802,208 B1 | 9/2010 | Waller et al. | |
| 7,890,909 B2 | 2/2011 | Pyapali et al. | |
| 7,934,177 B2 | 4/2011 | Shin | |
| 7,958,480 B1 | 6/2011 | Slonim et al. | |
| 8,006,216 B1 | 8/2011 | Chen et al. | |
| 8,028,253 B2 | 9/2011 | Drapeau | |
| 8,032,856 B2 | 10/2011 | Itagaki | |
| 8,045,546 B1 | 10/2011 | Bao et al. | |
| 8,050,256 B1 | 11/2011 | Bao et al. | |
| 8,108,823 B2 | 1/2012 | Allen et al. | |
| 8,239,806 B2 | 8/2012 | Chen et al. | |
| 8,250,507 B1 | 8/2012 | Agarwal et al. | |
| 8,286,111 B2 | 10/2012 | Chandra et al. | |
| 8,375,348 B1 | 2/2013 | Raj et al. | |
| 8,418,110 B2 | 4/2013 | Keinert et al. | |
| 8,473,885 B2 | 6/2013 | Cohn et al. | |
| 8,490,036 B2 | 7/2013 | Waller | |
| 8,495,547 B2 | 7/2013 | Keinert et al. | |
| 8,495,549 B2 | 7/2013 | Maruyama et al. | |
| 8,510,703 B1 | 8/2013 | Wadland et al. | |
| 8,560,998 B1 | 10/2013 | Salowe et al. | |
| 8,612,914 B2 | 12/2013 | Sherlekar et al. | |
| 8,640,080 B1 | 1/2014 | Salowe et al. | |
| 8,645,893 B1 | 2/2014 | Yeung et al. | |
| 8,671,368 B1 | 3/2014 | Salowe et al. | |
| 8,683,418 B2 | 3/2014 | Bose et al. | |
| 8,689,121 B2 | 4/2014 | O'Riordan | |
| 8,737,392 B1 | 5/2014 | Bao et al. | |
| 8,769,455 B1 | 7/2014 | Singh et al. | |
| 8,782,586 B2 | 7/2014 | Sezginer et al. | |
| 2001/0038612 A1 | 11/2001 | Vaughn et al. | |
| 2003/0014201 A1 | 1/2003 | Schultz | |
| 2003/0084418 A1 | 5/2003 | Regan | |
| 2003/0126578 A1 | 7/2003 | Wadland et al. | |
| 2004/0143797 A1 | 7/2004 | Nguyen et al. | |
| 2006/0288323 A1 | 12/2006 | Birch | |
| 2007/0044060 A1 | 2/2007 | Waller | |
| 2007/0101303 A1 | 5/2007 | Lien | |
| 2007/0106969 A1 | 5/2007 | Birch et al. | |
| 2007/0162884 A1 | 7/2007 | Matsuno et al. | |
| 2007/0245286 A1 | 10/2007 | Ueda | |
| 2008/0072182 A1 | 3/2008 | He et al. | |
| 2008/0244504 A1 | 10/2008 | Drapeau | |
| 2009/0055792 A1 | 2/2009 | Itagaki | |
| 2009/0144688 A1 | 6/2009 | Uchino et al. | |
| 2009/0172628 A1 | 7/2009 | Chyan | |
| 2010/0011327 A1 | 1/2010 | Becker et al. | |
| 2010/0037200 A1 | 2/2010 | Ghan | |
| 2010/0100862 A1 | 4/2010 | Ohtsuka | |
| 2010/0106274 A1 | 4/2010 | Konno et al. | |
| 2010/0115479 A1 | 5/2010 | Hatano et al. | |
| 2010/0122227 A1 | 5/2010 | Waller | |
| 2010/0122228 A1 | 5/2010 | McCracken et al. | |
| 2010/0199253 A1 | 8/2010 | Cheng et al. | |
| 2010/0205575 A1 | 8/2010 | Arora et al. | |
| 2010/0229140 A1 | 9/2010 | Strolenberg et al. | |
| 2010/0306727 A1 | 12/2010 | Itagaki | |
| 2011/0014786 A1 | 1/2011 | Sezginer | |
| 2011/0055784 A1 | 3/2011 | Gao et al. | |
| 2011/0119648 A1 | 5/2011 | Chen et al. | |
| 2011/0185329 A1* | 7/2011 | Wen et al. | 716/130 |
| 2011/0214100 A1 | 9/2011 | McElvain | |
| 2011/0219341 A1 | 9/2011 | Cao et al. | |
| 2011/0260318 A1 | 10/2011 | Eisenstadt | |
| 2011/0296360 A1 | 12/2011 | Wang et al. | |
| 2012/0079442 A1 | 3/2012 | Akar et al. | |
| 2012/0131528 A1 | 5/2012 | Chen et al. | |
| 2012/0241986 A1 | 9/2012 | Sherlekar et al. | |
| 2012/0286331 A1 | 11/2012 | Aton et al. | |
| 2013/0019220 A1 | 1/2013 | Maruyama et al. | |
| 2013/0036396 A1 | 2/2013 | Arayama et al. | |
| 2013/0086543 A1 | 4/2013 | Agarwal et al. | |
| 2013/0086545 A1 | 4/2013 | Alpert et al. | |
| 2013/0155555 A1 | 6/2013 | Blanc et al. | |
| 2013/0159965 A1 | 6/2013 | Karatal et al. | |
| 2014/0157220 A1 | 6/2014 | Arayama et al. | |
| 2014/0167117 A1 | 6/2014 | Quandt et al. | |

OTHER PUBLICATIONS

Lin et al., "Double Patterning Lithography Aware Grid less Detailed Routing with Innovative Conflict Graph,"'DAC'1 0, Jun. 13-18, 2010, pp. 398-403."

Agilent Technologies, "Momentum", 2006, Agilient, pp. 1-40.

Cho et al., "Double Patterning Technology Friendly Detailed Routing", IEEE/ACM International Conference, 2008, pp. 506-511.

Dion et al., Contour: A Tile-based Gridless Router, 30 pages, Western Research Laboratory, Mar. 1995.

Non-Final Office Action dated Sep. 19, 2013 for U.S. Appl. No. 13/602,071.

Notice of Allowance dated Mar. 21, 2014 for U.S. Appl. No. 13/602,071.

Notice of Allowance dated Jul. 14, 2014 for U.S. Appl. No. 13/602,071.

Ex-parte Quayle Office Action dated May 23, 2014 for U.S. Appl. No. 13/602,069.

Non-Final Office Action dated Sep. 20, 2013 for U.S. Appl. No. 13/602,069.

Final Office Action dated Oct. 4, 2013 for U.S. Appl. No. 13/705,164.

Non-Final Office Action dated Jun. 5, 2013 for U.S. Appl. No. 13/705,164.

Non-Final Office Action dated Sep. 3, 2014 for U.S. Appl. No. 13/705,164.

Notice of Allowance dated Jan. 22, 2014 for U.S. Appl. No. 13/705,164.

Notice of Allowance dated May 16, 2014 for U.S. Appl. No. 13/705,164.

Notice of Allowance dated Sep. 25, 2014 for U.S. Appl. No. 13/931,707.

Non-Final Office Action dated Aug. 4, 2014 for U.S. Appl. No. 13/931,568.

Hsu et al., "Template-Mask Design Methodology for Double Patterning Technology," 2010 IEEE, pp. 107-111.

Hwang, Chanseok, and Massoud Pedram. "Interconnect design methods for memory design." Proceedings of the 2004 Asia and South Pacific Design Automation Conference. IEEE Press, 2004.

(56) References Cited

OTHER PUBLICATIONS

Jeffrey Salowe, "Gridding for Advanced Process Nodes" 2012.
Jones, David L., "PCB Design Tutorial, Revision A", Jun. 29, 2004, David L. Jones and www.alternatezone.com, pp. 1-25.
Lin, I-Jye, Tsui-Yee Ling, and Yao-Wen Chang. "Statistical circuit optimization considering device and interconnect process variations." Proceedings of the 2007 international workshop on System level interconnect prediction. ACM, 2007.
Ou, Hung-Chih, Hsing-Chih Chang Chien, and Yao-Wen Chang. "Simultaneous analog placement and routing with current flow and current density considerations." Proceedings of the 50th Annual Design Automation Conference. ACM, 2013.
Pompl, T., et al. "Practical aspects of reliability analysis for IC designs." Proceedings of the 43rd annual Design Automation Conference. ACM, 2006.
Singh, Jaskirat, and Sachin S. Sapatnekar. "Topology optimization of structured power/ground networks." Proceedings of the 2004 international symposium on Physical design. ACM, 2004.
U.S. Appl. No. 13/602,069, filed Aug. 31, 2012.
U.S. Appl. No. 13/602,071, filed Aug. 31, 2012.
U.S. Appl. No. 13/692,970, filed Dec. 3, 2012.
U.S. Appl. No. 13/705,164, filed Dec. 4, 2012.
Wang, Laung-Terng, Charles E. Stroud, and Nur A. Touba. System-on-chip test architectures: nanometer design for testability. Morgan Kaufmann, 2010.
Notice of Allowance dated Jun. 4, 2014 for U.S. Appl. No. 13/931,689.
Non-Final Office Action dated Apr. 2, 2014 for U.S. Appl. No. 13/931,503.
Final Office Action dated May 1, 2014 for U.S. Appl. No. 13/931,707.
Non-Final Office Action dated Oct. 28, 2013 for U.S. Appl. No. 13/931,707.
Non-Final Office Action dated Dec. 6, 2013 for U.S. Appl. No. 13/931,689.
Non-Final Office Action dated Jun. 13, 2014 for U.S. Appl. No. 13/931,627.
Final Office Action dated Jul. 17, 2014 for U.S. Appl. No. 13/931,503.
Notice of Allowance dated Mar. 3, 2015 for U.S. Appl. No. 13/931,627.
Notice of Allowance dated Apr. 2, 2015 for U.S. Appl. No. 13/705,164.
Notice of Allowance dated Apr. 8, 2015 for U.S. Appl. No. 13/931,568.
Non-Final Office Action dated Apr. 10, 2015 for U.S. Appl. No. 13/931,689.
Notice of Allowance dated Jun. 10, 2015 for U.S. Appl. No. 14/318,507.
Notice of Allowance dated Nov. 10, 2014 for U.S. Appl. No. 13/931,503.
Final Office Action dated Nov. 17, 2014 for U.S. Appl. No. 13/931,627.
Non-Final Office Action dated Dec. 19, 2014 for U.S. Appl. No. 14/318,507.
Final Office Action dated Dec. 31, 2014 for U.S. Appl. No. 13/931,568.
Notice of Allowance dated Dec. 31, 2014 for U.S. Appl. No. 13/931,689.
Notice of Allowance dated Feb. 6, 2015 for U.S. Appl. No. 13/602,069.
Non-Final Office Action dated Dec. 19, 2014 for U.S. Appl. No. 13/705,164.
Notice of Allowance dated Sep. 25, 2015 for U.S. Appl. No. 13/931,689.

* cited by examiner

METHODS, SYSTEMS, AND ARTICLES OF MANUFACTURE FOR IMPLEMENTING ELECTRONIC DESIGNS USING FLEXIBLE ROUTING TRACKS

CROSS-REFERENCE TO RELATED APPLICATION(S)

This Application is related to U.S. patent application Ser. No. 13/602,071 filed on Aug. 31, 2012 and entitled "METHODS, SYSTEMS, AND ARTICLES OF MANUFACTURE FOR ROUTING AN ELECTRONIC DESIGN USING SPACETILES", patent application Ser. No. 13/602,069 filed on Aug. 31, 2012 and entitled "METHODS, SYSTEMS, AND ARTICLES OF MANUFACTURE FOR ROUTING AN ELECTRONIC DESIGN USING SPACETILES", U.S. patent application Ser. No. 13/931,689 filed on Jun. 28, 2013 and entitled "METHODS, SYSTEMS, AND ARTICLES OF MANUFACTURE FOR ASSOCIATING TRACK PATTERNS WITH RULES FOR ELECTRONIC DESIGNS", U.S. patent application Ser. No. 13/931,707 filed on Jun. 28, 2013 and entitled "METHODS, SYSTEMS, AND ARTICLES OF MANUFACTURE FOR AUTOMATICALLY ASSIGNING TRACK PATTERNS TO REGIONS FOR PHYSICAL IMPLEMENTATION OF AN ELECTRONIC DESIGN", U.S. patent application Ser. No. 13/931,627 filed on Jun. 28, 2013 and entitled "METHODS, SYSTEMS, AND ARTICLES OF MANUFACTURE FOR ASSIGNING TRACK PATTERNS TO REGIONS OF AN ELECTRONIC DESIGN", U.S. patent application Ser. No. 13/931,503 filed on Jun. 28, 2013 and entitled "METHODS, SYSTEMS, AND ARTICLES OF MANUFACTURE FOR IMPLEMENTING A PHYSICAL ELECTRONIC DESIGN WITH AREA-BOUNDED TRACKS", and U.S. patent application Ser. No. 13/931,568 filed on Jun. 28, 2013 and entitled "METHODS, SYSTEMS, AND ARTICLES OF MANUFACTURE FOR INTERACTIVELY IMPLEMENTING PHYSICAL ELECTRONIC DESIGNS WITH TRACK PATTERNS", the content of the aforementioned U.S. patent applications is hereby expressly incorporated by reference in its entirety for all purposes.

COPYRIGHT NOTICE

A portion of the disclosure of this patent document includes material, which is subject to copyright protection. The copyright owner has no objection to the facsimile reproduction by anyone of the patent document or the patent disclosure, as it appears in the United States Patent and Trademark Office patent file or records, but otherwise reserves all copyright rights whatsoever.

BACKGROUND

Integrated circuits, or ICs, are created by patterning a substrate and materials deposited on the substrate. The substrate is typically a semiconductor wafer. The patterned features make up devices and interconnections. This process generally starts with a designer creating an integrated circuit by hierarchically defining functional components of the circuit using a hardware description language. From this high-level functional description, a physical circuit implementation dataset is created, which is usually in the form of a netlist. This netlist identifies logic cell instances from a cell library, and describes cell-to-cell connectivity.

Many phases of these electronic design activities may be performed with computer aided design (CAD) tools or electronic design automation (EDA) systems. For example, an integrated circuit designer may use a set of layout EDA application programs, such as a layout editor, to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools. Verification may include, for example, design rule checking to verify compliance with rules established for various IC parameters. The EDA layout editing tools are often performed interactively so that the designer can review and provide careful control over the details of the electronic design.

Typically, geometric information about the placement of the nodes and components onto the chip is determined by a placement process and a routing process. The placement process is a process for placing electronic components or circuit blocks on the chip and the routing process is the process for creating interconnections between the blocks and components according to the specified netlist. The task of all routers is the same—routers are given some pre-existing polygons consisting of pins on cells and optionally some pre-routes from the placers to create geometries so that all pins assigned to different nets are connected by wires and vias, that all wires and vias assigned to different nets do not overlap, and that all design rules are obeyed. That is, a router fails when two pins on the same net that should be connected are open, when two pins on two different nets that should remain open are shorted, or when some design rules are violated during routing.

A layout file is created from the placement and routing process, which assigns logic cells to physical locations in the device layout and routes their interconnections. The physical layout is typically described as many patterned layers, and the pattern of each layer is described by the union of a set of polygons. The layout data set is stored, for example in GDSII ("Graphic Data System II") or OASIS ("Open Artwork System Interchange Standard") formats. Component devices and interconnections of the integrated circuit are constructed layer by layer. A layer is deposited on the wafer and then it is patterned using a photolithography process and an etch process.

Traditionally, track patterns include parallel tracks with uniform pitches, and the tracks cover entire layout space. This conventional approach does not satisfy the needs for electronic layout with a typical half-pitch of 14 nm or below. With the typical half-pitch advancing to 14 nm or below, the track patterns for a certain metal layer may be required or desired to be region-based where one track pattern may be associated with or assigned to a region on one layer, while another track pattern may be associated with or assigned to another region on the same layer. Some designs may even demand or desire non-uniform track patterns. Conventional approaches do not allow periodic changes of track pitches and definitions of regions where one or more track patterns are active. These track pattern requirements pose a challenge for physical design implementation, especially for interactive layout editing. In addition, users may need to interactively define track pattern(s) during the chip floorplanning or placement stage and follow such track pattern(s) during subsequent physical design stages such as routing, post-layout optimization, engineering change order (ECO), or even specific physical design tasks such as wire editing.

In addition, advanced manufacturing processes have imposed new requirements on electronic designs. For example, certain manufacturing processes require that wires on certain layers (e.g., metal 1 layer, metal 2 layer, etc.) are to be on certain routing tracks (e.g., subject to on-track requirements), while wires on certain other layers (e.g., metal 5 layer, metal 6 layer, etc.) may be physically implemented (e.g., through placement or routing processes) without track requirements. Some manufacturing processes may further require that certain regions on a routing layer be subject to some on-track requirements, while another region (or another regions) are not subject to any on-track requirements.

Thus, there exists a need for methods, systems, and articles of manufacture for implementing electronic design using flexible routing tracks.

SUMMARY

Disclosed are method(s), system(s), and article(s) of manufacture for implementing electronic design using flexible routing tracks in one or more embodiments. Some embodiments are directed at a method for interconnecting two regions that are subject to different rules (e.g., routing rules, width rules for interconnects, on-track rules, etc.) and using one or more transition rules in one or more transition regions, one or more cost mechanisms, or combinations thereof to implement the interconnection, where these one or more rules may include one or more soft rules, one or more hard rules, or combinations thereof. In these embodiments, these two regions may reside on the same routing layer or on different routing layers. These embodiments allow physical design tools to transition across two or more regions on the same or different layers, and each region may be gridded, gridless, tracked, or trackless.

Some other embodiments are directed at another method that interconnects an object subject to the first rule(s) and the second rule(s), while the object satisfies or violates the first rule(s). These embodiments use one or more spacetiles on a spacetile layer (e.g., a via spacetile layer) as one or more search probes to find viable implementation solutions (e.g., viable routing solutions), although the one or more spacetiles and hence the one or more search probes may violate one or more rules.

For example, a spacetile that is identified as the search probe may not be aligned with any tracks and is thus considered as violating one or more on-track rules or requirements. In some of these embodiments, a spacetile layer may be identified, associated with, or created for each rule and may be associated with one or more relevant features that are subject to one or more relevant rules. For example, a spacetile layer identified or created for a first rule may be associated with only those tracks that may be used to implement an electronic design while complying with the first rule. In some other embodiments, a spacetile layer may be identified, associated with, or created for two or more relevant rules and hence may be associated with more than one feature that is subject to any of the two or more relevant rules.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
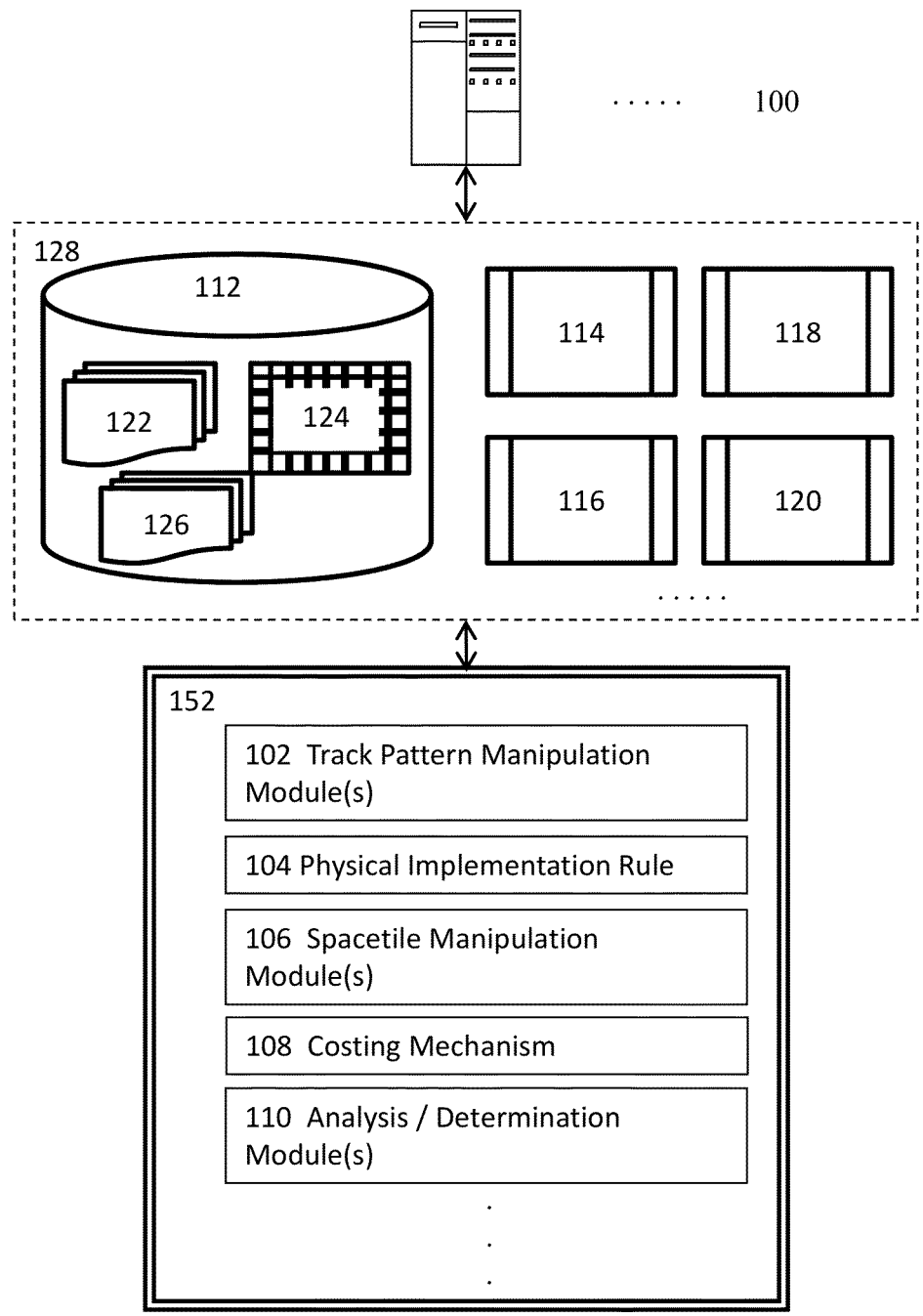
FIG. 1 illustrates a high level block diagram for a system for implementing electronic design using flexible routing tracks in some embodiments.

Various embodiments of the invention are directed to a methods, systems, and articles of manufacture for implementing electronic design using flexible routing tracks. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Disclosed are method(s), system(s), and article(s) of manufacture for implementing electronic design using flexible routing tracks in one or more embodiments. Some embodiments are directed at a method, system, or article of manufacture for interconnecting two regions that are subject to different rules (e.g., routing rules, width rules for interconnects, on-track rules, etc.) and using one or more transition rules in one or more transition regions, one or more cost mechanisms, or combinations thereof to implement the interconnection, where these one or more rules may include one or more soft rules, one or more hard rules, or combinations thereof. In these embodiments, these two regions may reside on the same routing layer or on different routing layers. These embodiments allow physical design tools to transition across two or more regions on the same or different layers, and each region may be gridded, gridless, tracked, or trackless.

Some other embodiments are directed at another method, system, or article of manufacture that interconnects an object subject to the first rule(s) and the second rule(s), while the object satisfies or violates the first rule(s). These embodiments use one or more spacetiles on a spacetile layer (e.g., a via spacetile layer) as one or more search probes to find viable implementation solutions (e.g., viable routing solutions), although the one or more spacetiles and hence the one or more search probes may violate one or more rules. For example, a spacetile that is identified as the search probe may not be aligned with any tracks and is thus considered as violating one or more on-track rules or requirements. In some of these embodiments, a spacetile layer may be identified or created for each rule and may be associated with one or more relevant features subject to one or more relevant rules. For example, a spacetile layer identified or created for a first rule may be associated with only the tracks that may be used to implement an electronic design while complying with the first rule. In some other embodiments, a spacetile layer may be associated with two or more relevant rule and hence more than on features subject to any of the two or more relevant rules.

FIG. 1 illustrates a high level block diagram for a system for implementing electronic design using flexible routing tracks in some embodiments. In one or more embodiments, the system for implementing electronic design using flexible routing tracks may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access various resources 128 that may comprise a global routing engine and/or a detail routing engine 114, a layout editor 116, a design rule checker 118, one or more verification engines 120, a floorplanner, etc. The one or more computing systems 100 may further write to and read from a local or remote volatile or non-volatile computer accessible storage medium 112 that stores thereupon data or information such as, but not limited to, one or more databases (124) such as schematic design database(s) or physical design database(s), libraries, data, rule decks for design rules, constraints, requirements, etc. (122), or other information or data (126) that may be used to facilitate the performance of various functions to achieve the intended purposes.

In some embodiments, the one or more computing systems 100 may, either directly or indirectly through various resources 128 to invoke various software, hardware modules or combinations thereof 152 that may comprises a track pattern or track pattern group manipulation module(s) 102 to, for example, label a plurality of track patterns, to associate one or more rules or requirements with a track pattern or a track pattern group, etc., one or more physical implementation modules 104 to, for example, place and route at least a part of an electronic design, one or more spacetile manipulation module 106 to create, merge, label, manipulate spacetiles, to identify one or more spacetiles as search probes, etc., one or more costing mechanisms 108 to identify, determine, or associate one or more costs with a physical implementation option (e.g., a viable routing solution, etc.), one or more analysis or determination modules 110 to perform various analyses or determinations such as design rule checks, constraint analysis (e.g., interactive constraint analysis), or to make various determinations.

For example, the method or system may interactively check whether an electronic design complies with various constraints or design rules (collectively constraints), such as some net-based spacing constraints that impose some limitations on the spacing between two nets, in a nearly real-time manner while the electronic design is being created in some embodiments. In these embodiments, the disclosed method or system uses the connectivity information provided by a connectivity engine or assigned by a designer to present feedback to a user as to whether a newly created object or a newly modified object complies or violates certain relevant constraints in an interactive manner or in nearly real-time without having to perform such constraints checking in batch mode. More details about the aforementioned modules will become clear and self-explanatory in the remainder of the description with reference to various other drawing figures.

Each of these modules in 152 may individually perform its intended functions or may function in conjunction with one or more other modules. For example, a physical implementation module 104 may work in conjunction with a spacetile manipulation module 106 and a track pattern manipulation module 102 to create a set of spacetiles, identify a set of spacetile tiles based at least in part upon the track patterns and/or some track requirements (e.g., on-track requirements for certain wires, etc.), identify a search probe, and then use the search probe to perform area-based search to identify or determine a viable routing solution for a particular segment of wire or a set of wires to be implemented in at least a part of an electronic designs.

Figure 2A:
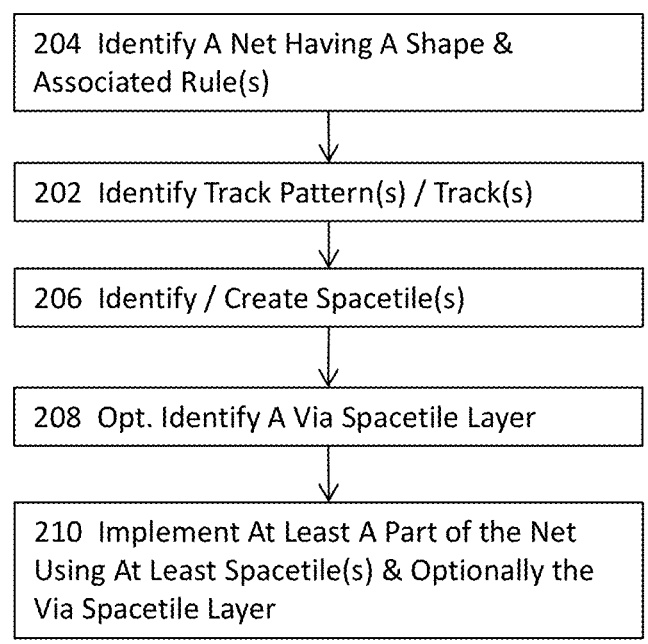
FIG. 2A illustrates a high level flow diagram for implementing electronic design using flexible routing tracks in some embodiments.

FIG. 2A illustrates a high level flow diagram for implementing electronic design using flexible routing tracks in some embodiments. In one or more embodiments, the method or system for implementing electronic design using flexible routing tracks may comprise the respective process or hardware module 202 for identifying one or more track patterns, where each track pattern includes a set of tracks at a pitch, and multiple track patterns may have the same, uniform pitch or different, non-uniform pitches. In some of these embodiments, the process or module 202 identifies these one or more track patterns for a metal layer or a routing layer (e.g., a metal 1 or M1 layer, a metal 2 or M2 layer, a first routing layer with a first routing direction, a second routing layer with a second routing direction, etc. and collectively "layer" or "layers" hereinafter) In some of these embodiments, the method or system may further comprise the respective process or module 204 for identifying a net having a shape and one or more rules that are associated with the net or with the shape.

In some embodiments, a shape includes a one-dimensional or two-dimensional geometric shape (e.g., a location or a two-dimensional object in a layout) in a physical electronic design such as a layout. In some embodiments, the one or more rules include one or more routing rules that are used to guide a router to perform physical routing such as global routing, channel-routing, conduit routing, or detail routing for at least a portion of the electronic design. In some of these embodiments, the one or more rules may include, for example but not limited to, a rule requiring certain wires to be on track in a certain region of a layer or on a certain layer, a width requirement for certain wires or certain tracks (e.g., a first wire is to have 3×-width, a first track is to be used to route a wire having a 5×-width), etc.

It shall be noted that an electronic design of interest may be associated with various widths for interconnects where 1×-width represents one unit width of a prescribed width value, 3×-width indicates three times the unit width, etc. In some of these embodiments, the method or system may further comprise the respective process or module 206 for identifying from existing or creating from scratch one or more spacetiles. A spacetile comprises an n-dimensional geometric entity in the routing space in some embodiments. The method may then identify a spacetile as an area probe to guide a router (e.g., a point-to-point router that routes an interconnect between two points in the design) to perform area search for routing an electronic design.

An area probe may be used to store information such as the information about the spacetile itself, various information about routing the interconnect (e.g., destination location, beginning location, etc.) in some embodiments. In some embodiments, the method may further mark or label the spacetiles. For example, the method may mark or label a spacetile as "on-track" or "off-track" based on the relationship between the spacetile and a track. In some embodiments, the method may further optionally comprise the act of determining costs of the one or more spacetiles from the spacetile punch. In some embodiments, the method or system may perform the spacetile punch process to identify or create all the spacetiles at once.

In some other embodiments, the method or system may perform the spacetile punch process to create only the needed spacetile(s) and may further invoke the spacetile punch process as needed. In some embodiments, the method may further comprise the act of determining whether there exist one or more constraints for routing some interconnects. In some of these embodiments, the process or module may use, for example, one or more spacetile manipulation modules 106 to identify the one or more spacetiles from existing spacetile(s) or to perform a spacetile punch process to create the one or more spacetiles from scratch. In these embodiments, the spacetile punch identifies usable routing space in the routing area and subdivides the routing space into one or more spacetiles.

The spacetile punch subdivides the routing space according to at least one or more design rules (e.g., one or more spacing rules or one or more width rules for interconnects, etc.) into one or more spacetiles. It shall be noted that the recitation of "a spacetile punch" does not necessarily a single spacetile punch. Rather, the recitation of "a spacetile punch" refers to the performance of the spacetile punch process, which is explained in greater details below, and thus may include one or more "spacetile punches".

In some of these embodiments, the method or system may further optionally comprise the respective process or module 208 for identifying a via spacetile. For example, in an electronic design where wrong-way routes are prohibited (e.g., only wires along the preferred-, permitted-, or right-way-direction are allowed on some routing layers or wires along the wrong-way-direction are prohibited on these routing layers), the process or module 208 may identify or create a via spacetile layer between two such adjacent routing layers to accommodate bends for a wire that cannot be achieved on a single layer.

In some of these embodiments, the process or module 208 may identify or create a via spacetile layer for, for example, the first routing layer and the second routing layer by aggregating the one or more features identified for both the first and the second routing layers into the via spacetile layers. In some of these embodiments, the method or system may further optionally comprise the respective process or module 210 for implementing at least a part of the net using at least some of the spacetiles identified or created at 206. In some of these embodiments, the process or module 210 may further optionally implement at least a part of the net using at least the via spacetile layer.

In some of these embodiments illustrated in FIG. 2A, different design configurations or requirements may require different implementation methodologies at 210. For example, a first design including pins or terminals perfectly aligned with tracks may be implemented with a different methodology from a second design including some pins misaligned with tracks yet may be implemented with taper rules. In addition, a third design including some pins misaligned with tracks yet cannot be implemented with taper or transition rules (collectively taper rule or taper rules) may also be implemented differently from the aforementioned first or the second design. A taper rule includes a routing rule which specifies, for a segment of an interconnect, whether or not a transition from a first track associated with a first width to a second track associated with a second width is permitted. Moreover, taper rules may allow a route to be considered as meeting the on-track requirement although the route is actually off-track in some embodiments. In these embodiments, taper rules provide more flexibility in accessing, for example, pins, terminals, pads, or other routing locations that are not aligned with any tracks.

Figure 2B:
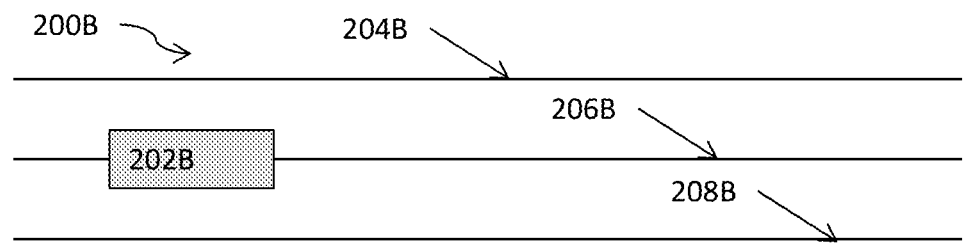
FIGS. 2B-2F illustrate some exemplary scenarios to which various embodiments described herein apply in some embodiments.

FIGS. 2B-2E illustrate some exemplary scenarios to which various embodiments described herein apply in some embodiments. More specifically, FIG. 2B illustrates a first configuration 200B having a pin 202B that is required by, for example, a routing rule to be routed with a 3×-wire. The three line segments, which may have finite length(s) or may extend infinitely, 204B, 206B, and 208B represent three routing tracks along a first direction. In some embodiments, a routing track (or a track for simplicity) includes an imaginary line or line segment that have no width and is non-physical in the design but may be used by a physical implementation tool (e.g., a router) to guide the physical implementation tool to find a implementation solution. Although a track does not have a width, a track may nonetheless be associated with a rule that requires or desires the track to be used to implement a wire having specific width value(s).

For example, a router may lay the centerline of a wire along a track on which the router determines that a viable routing solution is found. A track may also belong to a track pattern having one or more pitch values between two neighboring tracks in these embodiments. In the exemplary configuration illustrated in FIG. 2B, the centerline of the pin 202B is aligned with the track 206B. Therefore, a process or module (e.g., 106) may perform a spacetile punch with respect to the tracks to generate a spacetile for track 206B (a degenerated two-dimensional spacetile) that may be used as a search probe to find routing solution(s).

In these illustrated embodiments, the search probe aligned with 206B is also considered as an on-track probe because the search probe is aligned with a track. Moreover, because taper rules are permitted in this exemplary configuration, the search probe aligned with the center 206E may be considered a part of the via spacetile layer (e.g., $V_{2, \{3\times \to 1\times\}}$) where V denotes a via spacetile layer; 2 denotes the via spacetile layer is created between layer 1 and layer 2; and $\{3 \to \times 1\times\}$ denotes the permissible taper rule allowing transition from tracks associated with 3×-width requirement to tracks associated with 1×-width requirement.) As a result of the permissible taper rule, the router may implement the wire from or to the pin 202B while observing the on-track requirements, without associating additional cost that may negatively affect the viability of a routing solution.

Figure 2C:
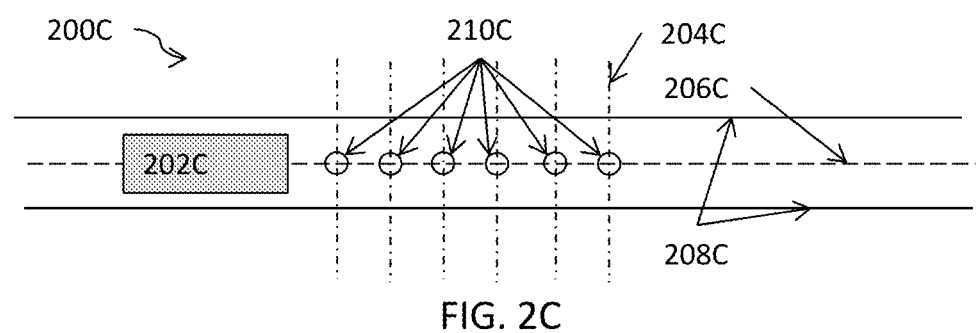

FIG. 2C illustrates the second configuration 200C that includes a pin 202C that is required by, for example, a routing rule to be routed with a 3×-wire. In addition, the second configuration 200C illustrates that the boundaries and the centerline 206C of the pin 202C is not aligned with any tracks 208C on this layer, and the corresponding 3×-tracks 204C on an immediately neighboring layer. FIG. 2C also illustrates the scenario where taper rules may be permitted in routing a wire so as to transition from a first width to a second width when determining a viable routing solution. For example, a process or module 106 may perform a spacetile punch process for the centerline 206C of the pin 202C to create a spacetile that is also aligned with the centerline 206C. Because the pin 202C is not aligned with any routing tracks 208C on the current layer, the method or the system may create a via spacetile layer that includes the spacetile aligned with the centerline 206C on the current layer and the spacetiles aligned with the tracks 204C on the immediately neighboring layer.

The method or the system may further use the spacetile manipulation module 106 to identify the potential via locations 210C at which a via may be located for the wire to transition from the spacetile along 206C to the spacetile along one of the tracks 204C associated with 3×-width. Compared to FIG. 2B, FIG. 2C illustrates the configuration where the centerline and the boundaries of a pin 202C are not aligned with the tracks on the layer on which the pin is located, whereas in FIG. 2B, the centerline of the pin 202B is aligned with the tracks of the layer on which the pin 202B is located. Because a router attempts to access the pin 202C which is not aligned with the tracks on the current layer, the router thus uses a via spacetile layer and the permitted taper rule to find a routing solution that starts at the pin 202C with a horizontal segment and ends at one of the potential via locations 210C on the current layer and then proceeds to one of the tracks 204C on the immediately neighboring layer to continue to find viable routing solutions while complying with the on-track requirements for the wire to the extent possible. In these embodiments illustrated in FIG. 2C, the taper rule allows the wire to obviate the on-track requirement for a short distance after which the routing solution transitions to the 3×-tracks on the immediately neighboring layer to comply with the on-track requirements.

Figure 2D:
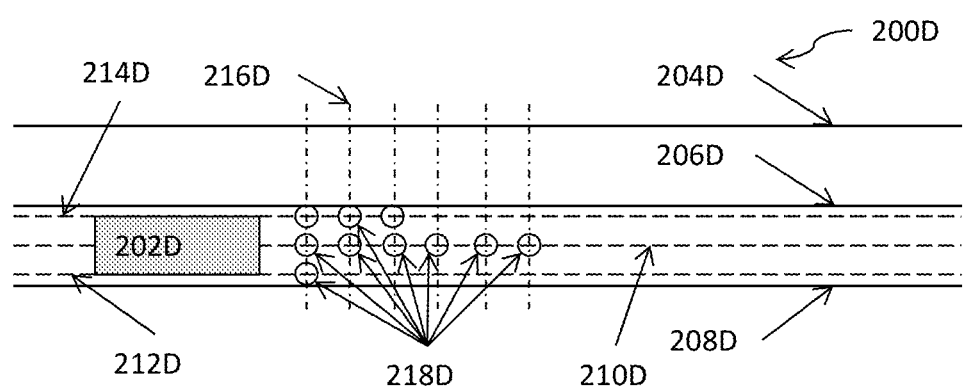

FIG. 2D illustrates the third exemplary configuration 200D that includes a pin 202D that is required by, for example, a routing rule to be routed with a 3×-wire. In this third exemplary configuration, the pin 202D is not aligned with the tracks 204D, 206D, and 208D on the current layer on which the pin 202D is located. Compared to the second exemplary configuration illustrated in FIG. 2C, taper rules are not allowed in this third exemplary configuration. FIG. 2D further illustrates the current layer, on which the pin 202D is located, has a set of tracks 204D, 206D, and 208D along a first direction and associated with, for example, a 3×-width routing rule that requires or desires the centerline of a wire be coincident with a track associated with 3×-width. The immediately neighboring layer (e.g., the layer immediately above the current layer) is associated with tracks 216D along a second direction and associated with, for example, a 3×-width routing rule that requires or desires the centerline of a wire be coincident with a track associated with 1×-width.

In this exemplary configuration, the method or system may use a cost mechanism (e.g., 108) to associate a route segment with a cost when the route segment fails to meet the on-track requirement. In some embodiments, the cost may even be proportional to the length of the route segment that fails to meet the on-track requirement. In this exemplary configuration, the router may invoke, for example, the spacetile manipulation process 106 to perform a spacetile punch to create three spacetiles 210D, 212D, and 214D, where 210D is aligned with the centerline of the pin 202D, and 212D and 214D are aligned with the horizontal boundary of the pin.

In addition, the router may start routing for accessing the pin 202D by using the spacetile 210D on the current layer as a search probe and performs area-based search for viable routing solutions along the search probe. Because this horizontal segment of the wire fails to meet the on-track requirement, the cost mechanism (e.g., the cost mechanism 108) may associate a cost with this horizontal segment. In order to reduce or minimize the associated cost, the router may thus attempt to comply with the on-track requirements to the extent possible. In the illustrated embodiments, if a wire segment falls on any of the tracks 204D, 206D, and 208D, the wire segment is considered on-track below (assuming the current layer is below the immediately neighboring layer having the vertical tracks 216D).

Moreover, a wire segment falls on any of the tracks 216D on the immediately neighboring layer is considered on-track above (assuming the current layer is below the immediately neighboring layer having the vertical tracks 216D). The intersections 218D are thus considered on-track above and below. Because the pin 202D is not aligned with the tracks 204D, 206D, and 208D on the current layer, the router thus attempts to observe the on-track requirement on the immediately neighboring layer to the extent possible to reduce or minimize the cost associated with off-track wire segment(s).

Figure 2E:
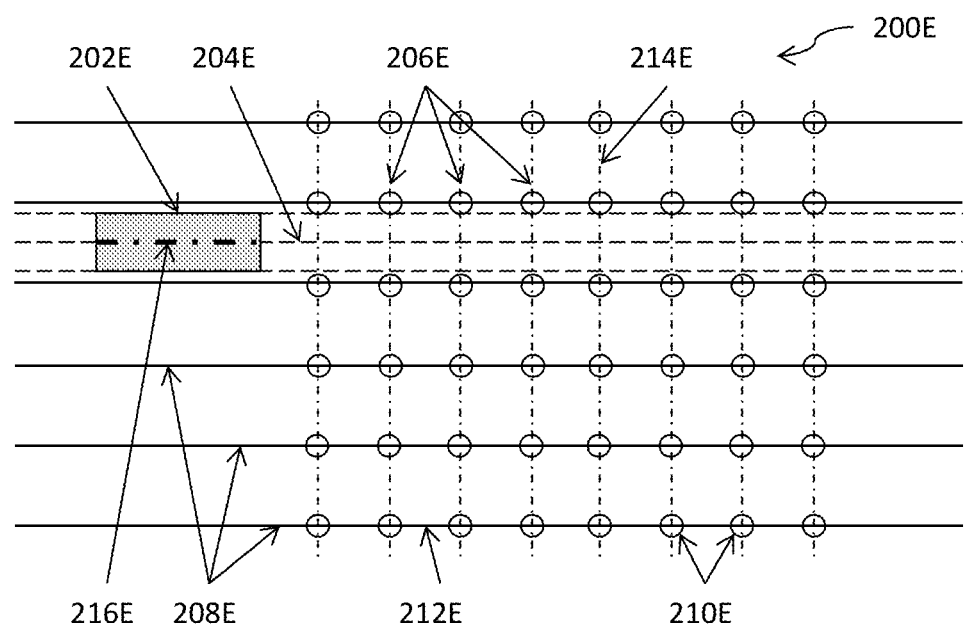

FIG. 2E illustrates a similar exemplary configuration 200E as FIG. 2D. More specifically, FIG. 2E illustrates the third exemplary configuration 200E that is similar to that illustrated in FIG. 2D where no taper rule is allowed and includes a pin 202E that is required by, for example, a routing rule to be routed with a 3×-wire. In this third exemplary configuration, the pin 202E is also not aligned with the tracks 204E, 206E, and 208E on the current layer on which the pin 202E is located. FIG. 2E further illustrates the current layer has a set of horizontal tracks 208E, and the immediately neighboring layer (e.g., immediately above) has a set of vertical tracks 206E.

In FIG. 2E, 204E represents the centerline of the pin 202E; 212E represents a track segment on which a wire segment is considered on-track below; 214E represents a 210E represents a track segment on which a wire segment is considered on-track above; and potential via locations and is thus on-track above and below. The method or the system may similarly invoke the spacetile manipulation module 106 to perform a spacetile punch process for the centerline 204E and optionally for the horizontal boundary of the pin 202E and identify the spacetile aligned with the centerline 204E as the search probe. Nonetheless, because no taper rules are permitted in this exemplary configuration as in FIG. 2D, the search probe aligned with the center 204E is not a part of the via spacetile layer (e.g., V2, 1× where V denotes a via spacetile layer; 2 denotes the via spacetile layer is created between layer 1 and layer 2; and 1× denotes the width requirement associated with the tracks.) The method or system may similarly invoke a cost mechanism (e.g., 108) to associate a wire segment failing to meet the on-track requirement with a cost as similarly described above.

In some embodiments where the rules only allow 1×-width to be associated with the tracks such that only 1×-tracks exist with no taper rules available for a layer or a region on a layer, the method or the system may mark or label certain spacetiles as "on track" while associating some costs with such spacetiles. For example, in the exemplary configuration illustrated in FIG. 2E where only 1×-tracks are available, the method and the system may mark or label the spacetile 216E, which represents the centerline within the boundary of pin 202E requiring a 3×-track for routing, as "on track" with additional cost although spacetile 216E is not actually on track. In this manner, the method or system may use this "on-track" spacetile as a search probe to lay out the centerline of the wire while incurring some cost for going off-track and extend the search probe as needed or desired to continue the search for viable routing solution while complying with the on-track requirement. Depending on whether or not wrong-way tracks or bends may be permitted, the router may attempt to jump to the immediately adjacent layer by identifying a via location that is located at an intersection between the search probe, which is marked as on-track although is in fact off-track, and jump to the immediately adjacent layer to use one of the tracks 206E to continue to implement the route, while minimizing or reducing the cost incurred for the portion of the route that does not meet the on-track requirement.

Figure 2F:
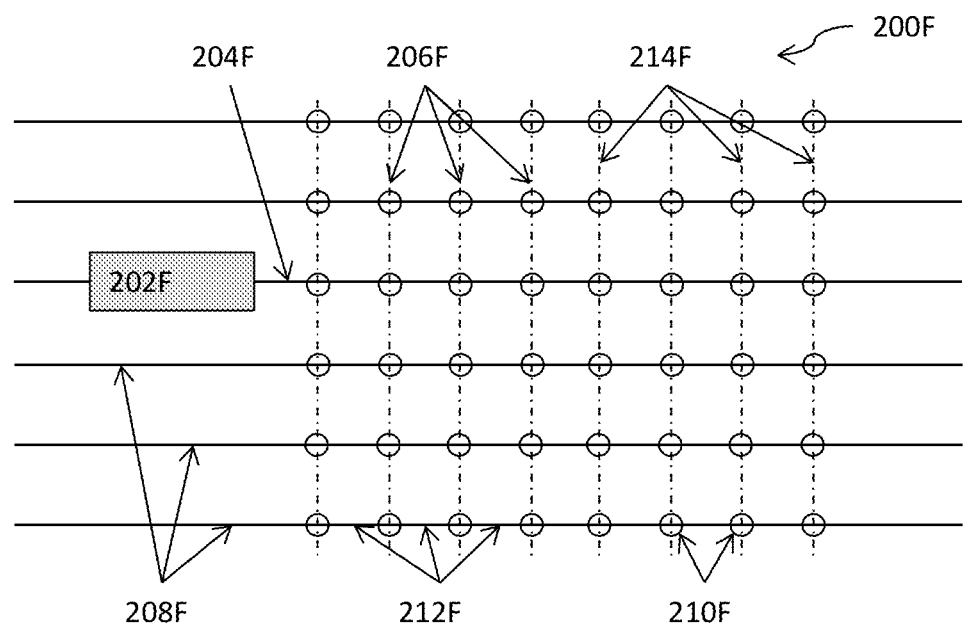

FIG. 2F illustrates a similar exemplary configuration 200F as FIG. 2C. More specifically, FIG. 2F illustrates the third exemplary configuration 200F that is similar to that illustrated in FIG. 2C where taper rule is allowed and includes a pin 202F that is required by, for example, a routing rule to be routed with a 3×-wire. FIG. 2F further illustrates a set of horizontal tracks 208F associated with 3×-width requirements for the current layer on which pin 202F is located. The exemplary configuration also includes a set of vertical tracks 206F associated with 1×-width requirements for the immediately neighboring layer (e.g., the layer immediately above the current layer). As a result, 3×-wire segments aligned with track segments 214F In this exemplary configuration 200F, the spacetile 204F created for the centerline of the pin 202F is considered a part of the via spacetile layer $V_{2, \{3\times\_1\times\}}$ because taper rules are allowed to transition between tracks associated with 3×-width and tracks associated with 1×-width.

Moreover, wire segments laid on track segments 214F are considered on-track above, but not below; and wire segments laid on track segments 212F are considered on-track below but not above. the intersections 210F in the via spacetile layer $V_{2, \{3\times\_1\times\}}$ are thus on-track above and below because these intersections. Although FIG. 2F illustrates only a set of 3×-tracks 208F on the current layer, the current layer may include more than the set of 3×-tracks 208F. For example, the current spacetile layer on which pin 202F is located may include a set of 3×-tracks 208F and a set of 1×-tracks (not shown) on the same spacetile layer, although the 1×-tracks will not be used in routing wires having 3×-width. In the alternative, the method or the system may have two different spacetile layers—one for the 3×-tracks and the other for the 1×-tracks.

In the above examples, the single spacetile layer including both 1×-tracks and 3×-tracks has more labels either of the two separate spacetile layers respectively including the 1×-tracks and the 3×-tracks due to more tracks for labeling. In the embodiments illustrated in FIG. 2F where taper rules are permitted in determining a route to or from pin 202F, the router may, for example, start with the search probe 204F, which is considered on-track, lay the centerline of the wire along the track aligned with the spacetile or search probe 204F, continue along the search probe 204 until a via location is reached, and continue the route using one of the 3×-tracks 206F on the immediately neighboring layer, and complete the route depending upon the destination location for the route.

Figure 3:
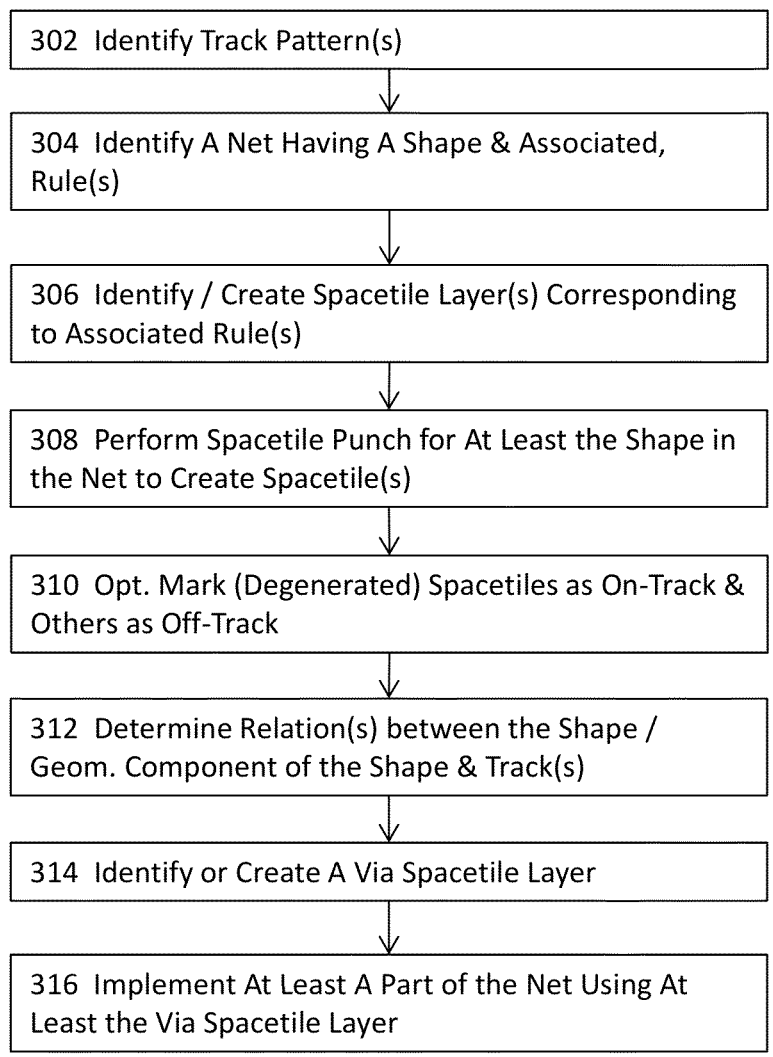
FIG. 3 illustrates a more detailed flow diagram for implementing electronic design using flexible routing tracks in some embodiments.

FIG. 3 illustrates a more detailed flow diagram for implementing electronic design using flexible routing tracks in some embodiments. In these embodiments, the method or system may comprise the respective process or module 302 for identifying one or more track patterns for a layer or for a region on a layer in substantially similar manners as those described for 202 of FIG. 2A. In some of these embodiments, the method or system may comprise the respective process or module 304 for identifying a net having a shape and associated with one or more rules. In some embodiments, the shape may include a terminal, a pin, a pad, any shape or object that serves as the source or the destination point of a route within a region, etc.

In some of these immediately preceding embodiments, a rule may be associated with, for example but not limited to, the shape, the net, two or more shapes or features (e.g., interconnects) in the net, between the net and another net, a region on the layer, the layer itself, one or more specific tracks, one or more specific track patterns, etc. For example, a rule may be governing one or more physical characteristics such as width, spacing, parallel run length, etc., one or more requirements such as an on-track requirement, a hard rule that must be met, a soft rule that is desired to be met, whether or not transition or taper is permitted (e.g., a taper rule for transitioning from a first track associated with a first width to a second track associated with a second width, whether or not fake track or spacetile marking is permitted (e.g., marking a spacetile as on-track while the spacetile is actually off-track), etc.

In some embodiments, the one or more rules may include, for example, a first rule that requires the shape in the net identified at 304 be accessed via a wire of a certain width, a second rule indicating a first track pattern is to be used to implement wires of certain width(s), etc. In some of these embodiments, the method or system may comprise the respective process or module 306 for identifying from existing or creating from scratch one or more spacetile layers corresponding to the associated rules. In some embodiments, the process or module 306 may identify or create a spacetile layer for each rule, and thus there will be multiple spacetile layers for multiple rules. In some embodiments, the process or module 306 may identify or create a spacetile layer for each track pattern. In these embodiments, a spacetile layer may be generated or identified on a per track pattern or per rule basis.

In some other embodiments, a single spacetile layer may be identified or created by the process or module 306 for all the track patterns. The one or more rules may include, for example, on-track requirements, whether or not taper rules are permitted or allowed, width requirement(s), etc. as described in various embodiments herein. In some of these embodiments, the method or system may comprise the respective process or module 308 for performing a spacetile punch for at least a part of the shape in the net identified at 304 to create one or more spacetiles.

For example, the process or module 308 may perform a spacetile punch process for the center line of a pin in a first direction to create a degenerated, one-dimensional spacetile. As another example, the process or module 308 may perform a spacetile punch process for a part of the boundary (e.g., the horizontal sides of a pin) to create two spacetiles. In some embodiments, the process or module 308 may perform the spacetile punch process to create all available spacetiles at once. In some other embodiments, the process or module 308 may perform the spacetile punch process to create the needed or desired one or more spacetiles as the physical implementation process proceeds. In some of these latter embodiments, the process or module 308 may thus perform the spacetile punch process multiple times.

In some of these embodiments, the method or system may optionally comprise the respective the process or module 310 for marking one or more spacetiles that coincide with certain tracks as on-track and one or more other spacetiles that are not aligned with any tracks as off-track. In some of these embodiments, the method or system may comprise the respective process or module 312 for determining one or more relations between the shape or its characteristics associated with at least a first rule of the one or more rules and at least some of the track patterns or tracks (e.g., the tracks in the vicinity of the shape). For example, the process or module 312 may determine whether the shape identified at 304 or any part thereof (e.g., a centerline in a first direction, a part of the boundary of the shape) is aligned with one or more tracks and identify the relation between the shape and the one or more tracks accordingly.

In the exemplary configuration illustrated in FIG. 2B, the process or module 312 may determine that the relation between the shape (e.g., the pin 202B) and track 206B is that the horizontal centerline of the shape is aligned with track 206B, but not tracks 204B or 208B. In the exemplary configuration illustrated in FIG. 2C, the process or module 312 may determine that the relation between the shape (e.g., the pin 202C) and the track 208C is that neither the horizontal centerline nor the horizontal boundary of the shape is aligned with any of the horizontal tracks 208C. In some of these embodiments, the method or system may optionally comprise the respective process or module 314 for identifying or creating a via spacetile layer.

In some embodiments where bends or wrong-way tracks are needed to implement a route from a source location to a destination location but nevertheless disallowed or prohibited, the method or the system may comprise the respective process or module 314. In these embodiments, the routing engine is permitted to use only the right-way tracks to implement the physical design and thus may need a via spacetile layer. In some of these embodiments where one or more taper rules are permitted to transition between tracks associated with different, incompatible rules (e.g., a 3x-track that is used to implement a wire of 3x-width vs. a 1x-track that is used to implement a wire of 1x-width), at least some of the spacetiles created for the shape (e.g., the spacetile created by performing a spacetile punch process for the centerline of a pin) may be aggregated to the via spacetile layer such that the at least some of the spacetiles may be used to implement the electronic design while meeting the on-track requirements even if these spacetiles are determined not to be aligned with any tracks and are thus off-track.

In some other embodiments where no taper rules are permitted to transition between tracks associated with different, incompatible rules, the spacetiles created for the shape may not be aggregated to the via spacetile layer and thus cannot be used to implement the physical design unless the spacetiles are actually aligned with some tracks one or both layers for which the via spacetile layer is created. In some of these embodiments, the method or system may comprise the respective process or module 316 for implementing at least a part of the net for the shape using at least the one or more spacetiles created at 308. In some of these embodiments where the via spacetile layer is also identified or created at 314, the method or system may also implement at least a part of the net for the shape using this additional via spacetile layer. In addition or in the alternative, the method or system may implement at least a part of the net for the shape based at least in part upon the one or more relations determined at 312.

For example, if the centerline of a pin requiring a 3x-wire is determined to be aligned with a first track as illustrated in FIG. 2B (and hence the relation is "coincident"), the method or the system may then perform a spacetile punch process for the first track and use the spacetile as an on-track search probe to find viable solutions. As another example, if the centerline of a pin requiring a 3x-wire is determine not to be aligned with any tracks as illustrated in FIG. 2C or 2D (and hence the relation is to be "non-coincident"), the method or the system may implement the same portion of an electronic design differently, depending upon whether or not taper rules are permitted in determining viable routing solutions.

Figure 4:
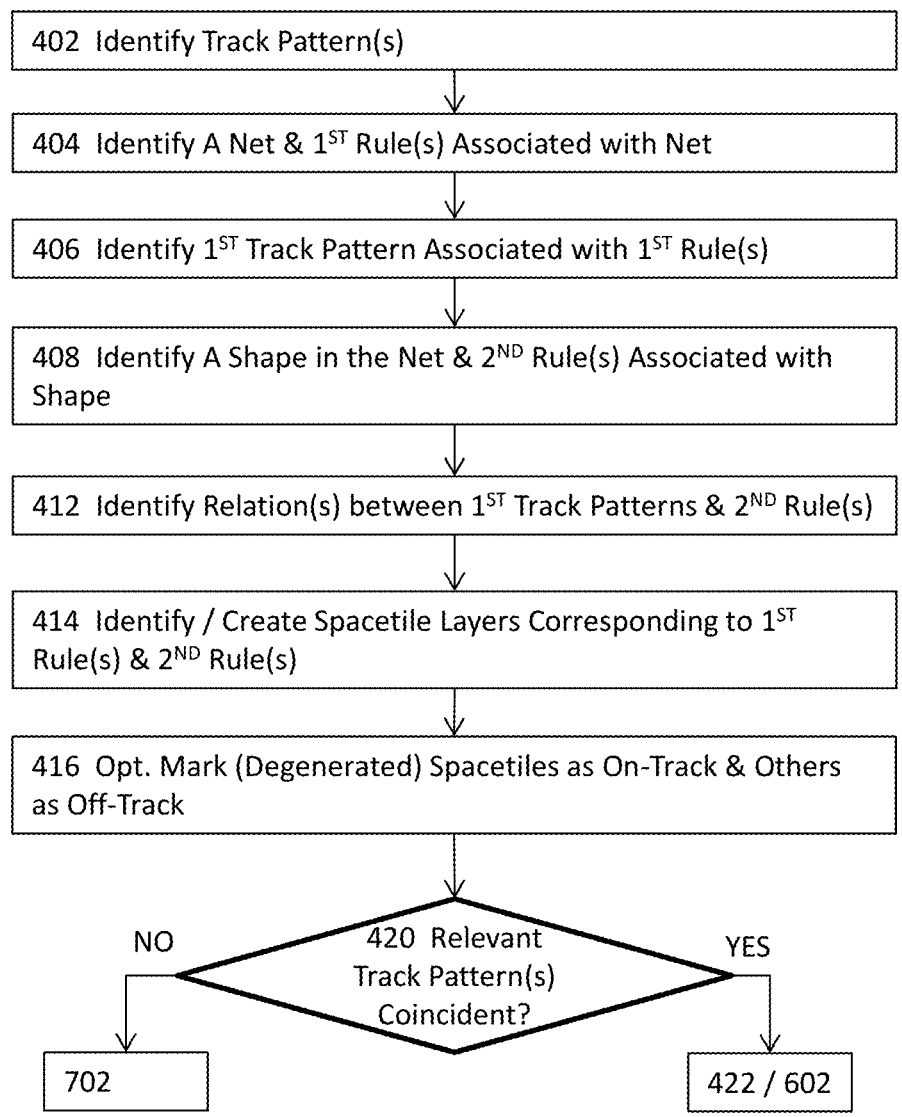
FIG. 4 illustrates a more detailed flow diagram for implementing electronic design using flexible routing tracks in some embodiments.

FIG. 4 illustrates a more detailed flow diagram for implementing electronic design using flexible routing tracks in some embodiments. In some of these embodiments, the method or system may comprise the respective process or module 402 for identifying one or more track patterns, each of which includes a set of tracks having a pitch value for a layer or for a region in a layer in substantially similar manners as those described for 302 or 202. In addition, the method or system may comprise the respective process or module 404 for identifying a net and one or more first rules that are associated with the net. In some of these embodiments, the method or system may comprise the respective process or module 406 for identifying a first track pattern associated with the one or more first rules.

For example, the process or module 404 may identify a 3x-rule requiring implementation of certain wires having 3x-width and a 1x-rule requiring implementation of some other wires having 1x-width, and processes or modules 406 and 408 may thus respectively identify one or more first track patterns that may be used to implement the wires having 3x-width for the 3x-rule and one or more second track patterns that may be used to implement the wires having 1x-width. It shall be noted that other track patterns such as the 5x-tracks used to implement wires having 5x-width may nonetheless exist but play no role in the implementation of the net and thus may be ignored in some of these embodiments. In addition, the method or system may comprise the respective process or module 408 for identifying a shape in the net and one or more second rules associated with the shape.

In some of these embodiments, the method or system may comprise the respective process or module 412 for identifying or determining one or more relations between the one or more first track patterns and the one or more second rules. For example, the process or module 412 may determine whether or not one or more tracks in the one or more first track patterns may be used to implement the physical design for the shape in the net and identify the relation accordingly in some embodiments. The process or module 412 may also determine whether or not a via is needed to implement the net including the shape or whether or not taper rules are permitted for implementing the net including the shape in view of the one or more second rules.

In the exemplary configuration illustrated in FIG. 2B, the process or module 412 may determine that track 206B is aligned with the horizontal centerline of the pin 202B requiring a 3x-wire and thus can be used to implement the wire to access pin 202B. In this example, the process or module 412 may further determine that a via is needed because only right-way tracks are permitted to be used for routing and further because one or more bends are needed due to the source and destination location of the route connecting the pin and another feature in the design. In some of these embodiments, the method or system may comprise the respective process or module 414 for identifying or creating one or more spacetile layers for the one or more first rules or the one or more second rules.

In some of these embodiments, the process or module 414 identifies or creates a spacetile layer for each rule, In these embodiments, a spacetile layer is associated with the associated one or more track patterns due to the association between the track patterns and the rules identified at 406. In addition, the process or module 414 may create one or more spacetiles in a spacetile layer by using the spacetile punch process as described above. In some of these embodiments, the method or system may optionally comprise the respective process or module 416 for marking the spacetiles as on-track or off-track according to the spatial relations between the spacetiles and the tracks on the spacetile layer. In some of these embodiments, the method or system may comprise the respective process or module 420 for determining whether or not a spacetile of interest (e.g. a search probe) is coincident with one or more relevant tracks or track patterns. For example, if a pin is subject to a 3x-rule requiring a wire having 3x-width be used to access the pin, the process or module 420 may determine whether there exist a 3x-track that is aligned with, for example, the spacetile obtained from the spacetile punch process for the centerline of the pin. In some embodiments where the spacetile of interest is determined to coincide with one or more relevant track patterns, the method or system may proceed to 422. Otherwise, the method or system may proceed to 602 or 702.

Figure 5:
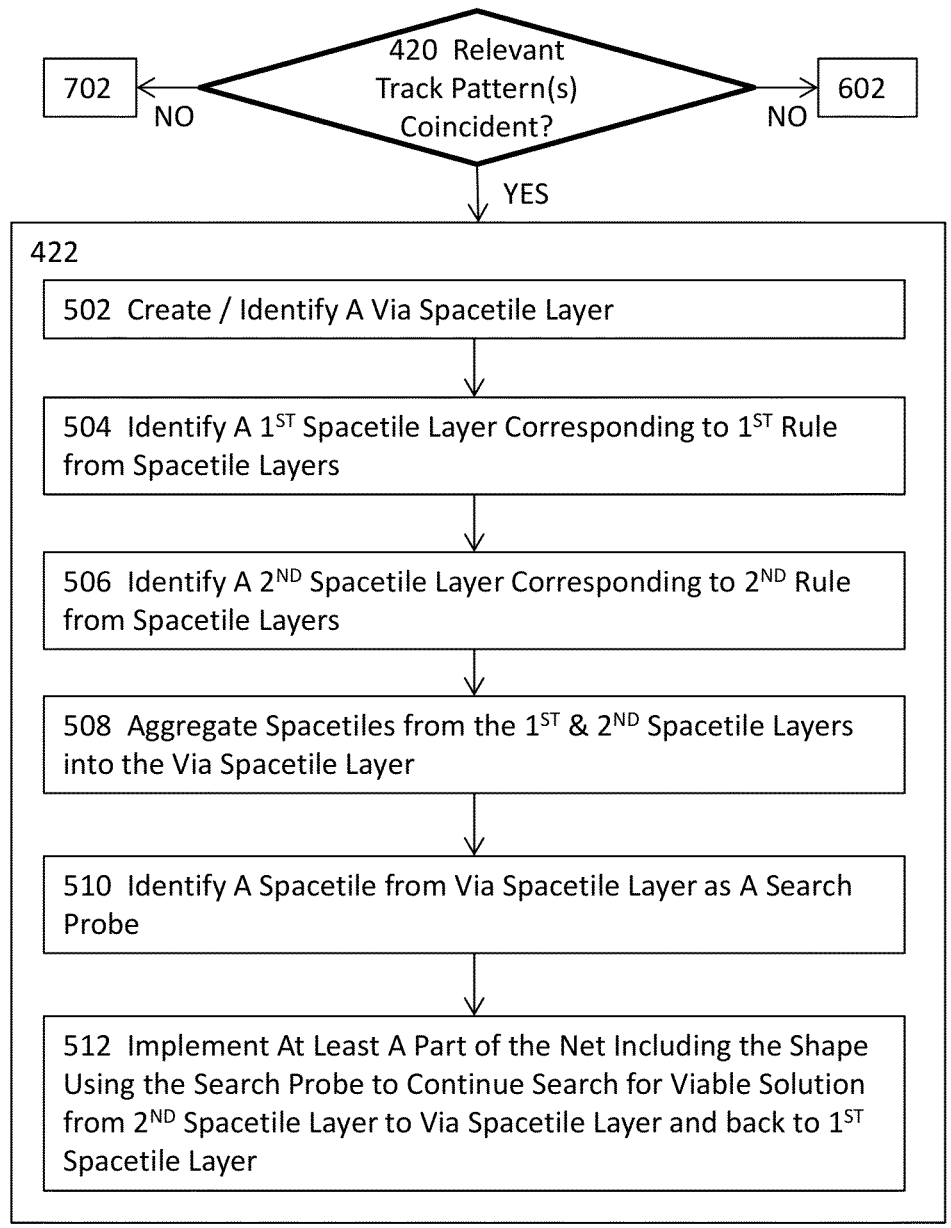
FIG. 5 illustrates a more detailed flow diagram for a process or module illustrated in FIG. 4 for implementing electronic design using flexible routing tracks in some embodiments.

FIG. 5 illustrates a more detailed flow diagram for a process or module illustrated in FIG. 4 for implementing electronic design using flexible routing tracks in some embodiments. More specifically, FIG. 5 illustrates a more detailed flow diagram for the processes or modules after the process or module 420 of FIG. 4 determines that a spacetile of interest (e.g. a search probe) is coincident with one or more relevant tracks. A relevant track includes a routing track that may be used to implement a route while meeting various rules such as the on-track rule, the width rule, or a taper rule, etc. Moreover, FIG. 5 illustrates the flow diagram that may be applied to the embodiments illustrated in FIG. 2B.

In the embodiments illustrated in FIG. 5, the method or the system may comprise the respective process or module 502 for identifying from existing or creating from scratch a via spacetile layer. In some of these embodiments, the method or the system may comprise the respective process or module 504 for identifying a first spacetile layer corresponding to a first rule from the one or more spacetile layers identified or created at 414. In some embodiments, the process or module 504 identifies a first spacetile layer for each rule, and thus a spacetile layer is identified on a per rule basis. In some of these embodiments, the method or the system may optionally comprise the respective process or module 506 for identifying or creating a second spacetile layer corresponding to the second rule that is associated with the shape identified at 408.

In some of these immediately preceding embodiments, the process or module 506 may invoke, for example, a spacetile manipulation process or module 106 to perform a spacetile punch process with respect to at least a portion of the shape to create the second spacetile layer for one or more newly created spacetiles for the shape. For example, the process or module 506 may perform the spacetile punch process for the centerline of the shape in a direction or for some of the boundary elements of the shape to create the spacetiles. In this example, the spacetiles thus created comprise a degenerated area-based geometric entities that may be used as search probes to find viable routing solutions along each of the created spacetiles. In the embodiments illustrated in FIG. 5, the process or module 420 has already determined that the shape is coincident with at least one of the tracks on the current layer on which the shape resides, the process or module In some of these embodiments, the method or the system may comprise the respective process or module 506 for identifying a spacetile from the via spacetile layer may not necessarily be performed and is thus optional.

In some of these embodiments, the method or the system may optionally comprise the respective process or module 508 for aggregating spacetiles or features in the current layer as well as in an immediately neighboring layer into the via spacetile layer identified or created at 502. In some of these embodiments, the process or module 508 may aggregate spacetiles or features into the via spacetile layer by aggregating into the via spacetile layers one or more features identified or created for both the current layer on which the shape resides and an immediately neighboring layer for which the via spacetile layer is identified or created. In some of these embodiments, the one or more features include one or more electronic design components, one or more electronic design blocks or cells, one or more blockages, one or more spacetiles, etc. for either routing layer.

In some of the aforementioned embodiments where bends or wrong-way routing is required but only right-way routing is permitted, the method or system may thus need another layer that is immediately neighboring the current layer on which the shape resides to accommodate the bends or wrong-way routing. The right-way routing includes implementing a route for a layer on which routes are to be implemented in only one direction (e.g., the preferred direction or one of the Manhattan directions) having two opposite orientations in some embodiments. The wrong-way routing includes implementing a route for a layer on which routes are to be implemented in the non-preferred direction of the layer. For example, if a layer is designated to have a first routing direction along 45-degree tracks, the right-way routing is to route wire segments only along at least some of these 45-degree tracks, and the wrong-way routing is to route wire segments along the 135-degree tracks or some imaginary lines at 135 degrees.

In some other embodiments where no bends or wrong-way routing is needed to implement the net, the method or the system need not perform the process or execute the modules related to the via spacetile layers because no vias are needed to implement the net. In some of these embodiments, the method or the system may optionally comprise the respective process or module 510 for identifying a spacetile from a spacetile layer as a search probe. In some embodiments where no bends are needed, the process or module 510 may identify a spacetile as the search probe from the spacetiles associated with the current layer on which the shape resides because no vias and hence no immediately neighboring layers are needed to implement the net. In some of these embodiments, the method or the system may comprise the respective process or module 512 for implementing at least a part of the net including the shape using the search probe to perform some area-based searches to find viable routing solutions based at least upon the source and destination locations of the net.

Figure 6:
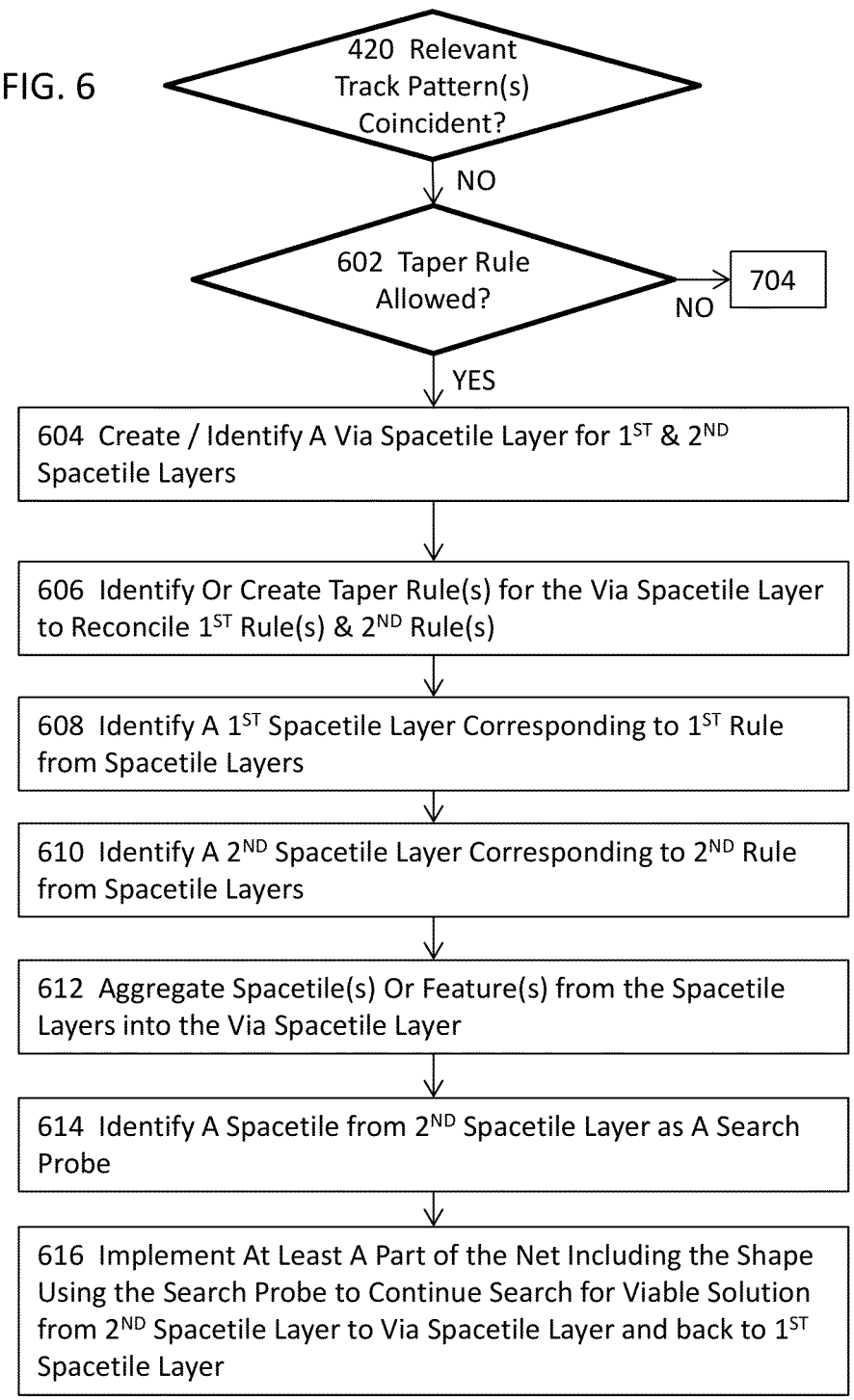
FIG. 6 illustrates a more detailed flow diagram for a process or module illustrated in FIG. 4 for implementing electronic design using flexible routing tracks in some embodiments.

FIG. 6 illustrates a more detailed flow diagram for a process or module illustrated in FIG. 4 for implementing electronic design using flexible routing tracks in some embodiments. More specifically, FIG. 5 illustrates a more detailed flow diagram for the processes or modules after the process or module 420 of FIG. 4 determines that a spacetile of interest (e.g. a search probe) is not coincident with one or more relevant tracks. Moreover, FIG. 6 illustrates the flow diagram that may be applied to the embodiments illustrated in FIGS. 2C and 2F. In some of these embodiments, the method or the system may comprise the respective process or module 602 for determining whether one or more taper rules are allowed to implement the net.

A taper rule includes a routing rule which specifies, for a segment of an interconnect, whether or not a transition from a first track associated with a first width to a second track associated with a second width is permitted. Moreover, taper rules may allow a route to be considered as meeting the on-track requirement although the route is actually off-track in some embodiments. In these embodiments, taper rules provide more flexibility in accessing, for example, pins, terminals, pads, or other routing locations that are not aligned with any tracks. In some of these embodiments, the method or the system may comprise the respective process or module 604 for identifying or creating a via spacetile layer for the first spacetile layer, on which the shape resides, and the immediately neighboring second spacetile layer. In some of these embodiments, the process or module 604 may further mark or label the first or the second spacetile layer with, for example, its associated rule(s), its associated routing layer, etc.

In some of these embodiments where the process or module 602 determines that a taper rule is allowed, the method or the system may comprise the respective process or module 606 for identifying one or more taper rules to implement the net including the shape that has been determined not to be aligned with any tracks at 420. In some of these embodiments, the method or the system may comprise the respective process or module 608 for identifying the first spacetile layer that corresponds to a first rule identified at 404 and the respective process or module 610 for identifying a second spacetile layer corresponding to the second rule associated with the shape from the one or more spacetile layers identified or created at 414. In some of the immediately preceding embodiments, the process or module 610 may invoke, for example, a spacetile manipulation process or module 106, to perform a spacetile punch process for at least a part of the net (e.g., the feature or location that serves as a source or a destination location for the net) to create one or more spacetiles for the second spacetile layer corresponding to or associated with the second rule.

For example, the process or module 610 may invoke the process or module 106 to perform a spacetile punch process for the centerline of the shape to create a spacetile aligned with the centerline. In these embodiments, the spacetile created at 610 may nonetheless be placed in the via spacetile layer by virtue of the taper rule even though the process or module 420 has already determined that the shape is not coincident or aligned with any of the tracks. In some of these embodiments, the method or the system may comprise the respective process or module 612 for aggregating one or more spacetiles or one or more features into the via spacetile layer from both the first spacetile layer and the second spacetile layer. For example, the process or module 612 may form a union for the one or more spacetiles or the one or more features and place the union in the correct locations of the via spacetile layer in some embodiments. In some of these embodiments, the method or the system may comprise the respective process or module 614 for identifying a spacetile from the via spacetile layer as a search probe for implementing physical electronic designs. In some of these embodiments, the method or the system may comprise the respective process or module 616 for implementing at least a part of the net including the net using at least the search probe to perform an area-based search (although the spacetile may include a degenerated area such as a line, a line segment, or a point) to find viable routing solutions.

Figure 7:
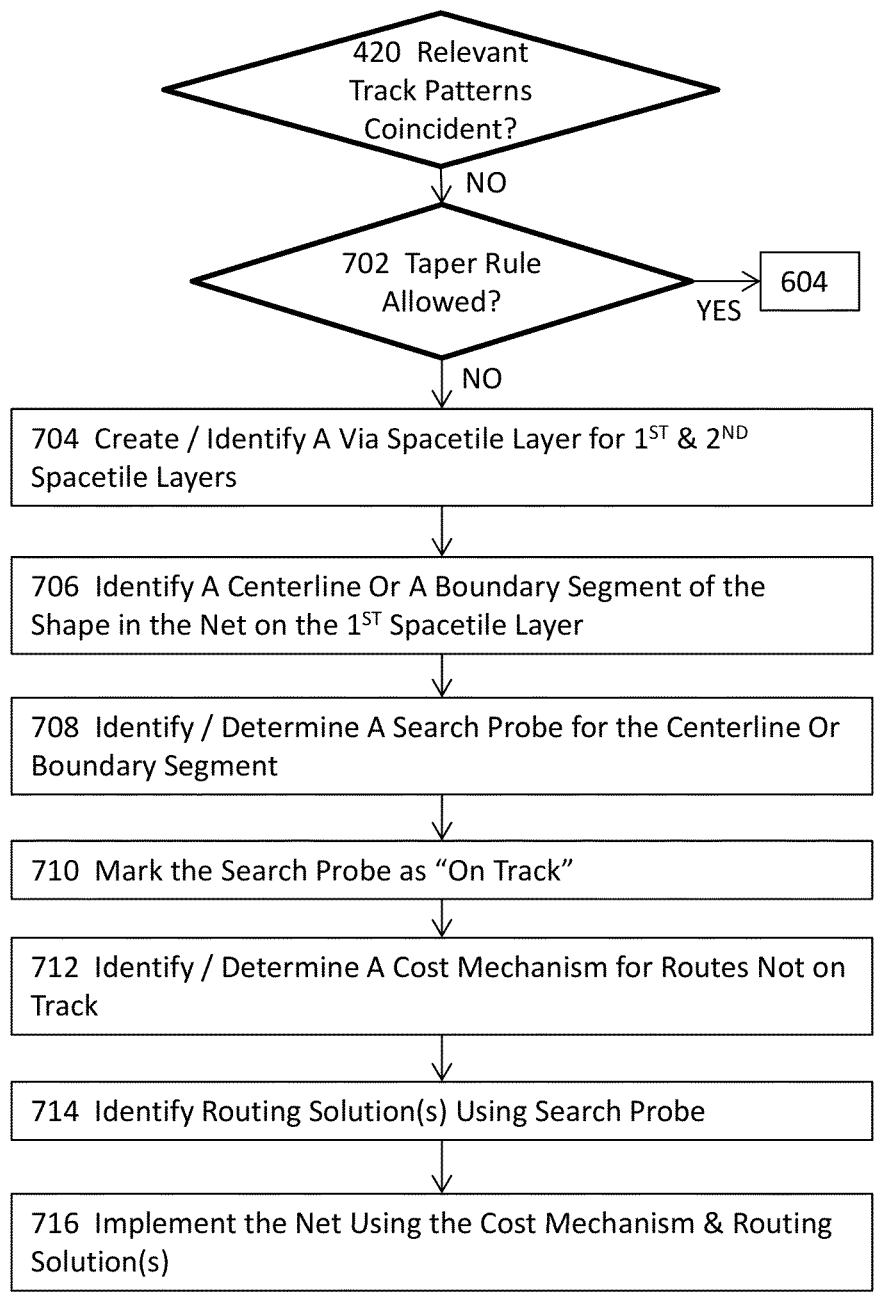
FIG. 7 illustrates a more detailed flow diagram for a process or module illustrated in FIG. 4 for implementing electronic design using flexible routing tracks in some embodiments.

FIG. 7 illustrates a more detailed flow diagram for a process or module illustrated in FIG. 4 for implementing electronic design using flexible routing tracks in some embodiments. More specifically, FIG. 7 illustrates a more detailed flow diagram for the processes or modules after the process or module 420 of FIG. 4 determines that a spacetile of interest (e.g. a search probe) is not coincident with one or more relevant tracks. Moreover, FIG. 7 illustrates the flow diagram that may be applied to the embodiments illustrated in FIGS. 2D-E where the pin is not aligned with any tracks, and no taper rules are permitted for transitioning. In some of these embodiments, the method or the system may comprise the respective process or module 702 for determining whether or not one or more taper rules are allowed or permitted in implementing the net.

In some embodiments where the process or module 702 determines that one or more taper rules are allowed or permitted, the method or system may proceed to 604 of FIG. 6. In some other embodiments where it is determined that no taper rules are allowed or permitted, the method or the system may comprise the respective process or module 704 for identifying or creating a via spacetile layer for a first spacetile layer and a second spacetile layer in substantially similar manners as those described for 604 of FIG. 6. In some of these embodiments, the method or the system may comprise the respective process or module 706 for identifying or determining a centerline or one or more boundary segments of the shape in the net identified at 408. In some of these embodiments, the method or the system may comprise the respective process or module 708 for identifying or determine a search probe for the centerline or the one or more boundary segments identified at 706. In some of these embodiments, the process or module 708 may invoke, for example, the spacetile manipulation module 106 to perform a spacetile punch process for the identified centerline or one or more boundary segments to create one or more spacetiles and then identify a spacetile as a search probe from the one or more spacetiles.

In some of these embodiments, the method or the system may comprise the respective process or module 710 for marking at least a portion of the identified or determined search probe as on-track, although the process or module 420 has already determined that the shape is not coincident or aligned with any tracks. In these embodiments, the method or system is actually bypassing or ignoring the on-track rule or requirement that requires an interconnect segment be aligned with a track although the method or system does so at a cost. In these embodiments, any interconnect or wire segments implemented along the search probe are also considered or marked as on-track because the search probe has been marked as on track, despite the fact that the search probe is in fact off track.

In some of these embodiments, the method or the system may comprise the respective process or module 712 for identifying or determining a cost mechanism for route segments that do not meet the on-track requirement. In some of these embodiments, the cost mechanism may associate a constant cost with an interconnect or wire segment, regardless of its length. In some other embodiments, the cost mechanism may associate a linear or non-linear cost with an interconnect or wire segment based at least in part upon the length of the interconnect or wire segment that does not meet the on-track requirement. In some other embodiments, the cost mechanism may associate a prohibited cost with an interconnect or wire segment based at least in part upon, for example, the criticality of the interconnect or wire segment, the net, or one or more neighboring nets or circuit components. In these immediately preceding embodiments where the cost mechanism determines to associate a prohibited cost with a routing solution, the method or system may further send a warning, message, or other forms of communication to cause the shape, a part of the net, or a part of the electronic design to be redesigned to avoid the prohibited cost.

In some of these embodiments, the method or the system may comprise the respective process or module 714 for identifying one or more viable routing solutions by using the area-based search probe, although the search probe may be a degenerated entity that does not necessarily correspond to a two-dimensional area in some of these embodiments. For example, the spacetile created by performing the spacetile punch process for a centerline of the shape constitutes a degenerated area. Nonetheless, the process or module 714 may use this degenerated area-based search probe to perform an area-based search to find the one or more viable routing solutions. In some of these embodiments, the method or the system may comprise the respective process or module 716 for implementing at least a part of the net including the shape by using the search probe identified at 714 and the cost mechanism identified or determined at 716.

Figure 8A:
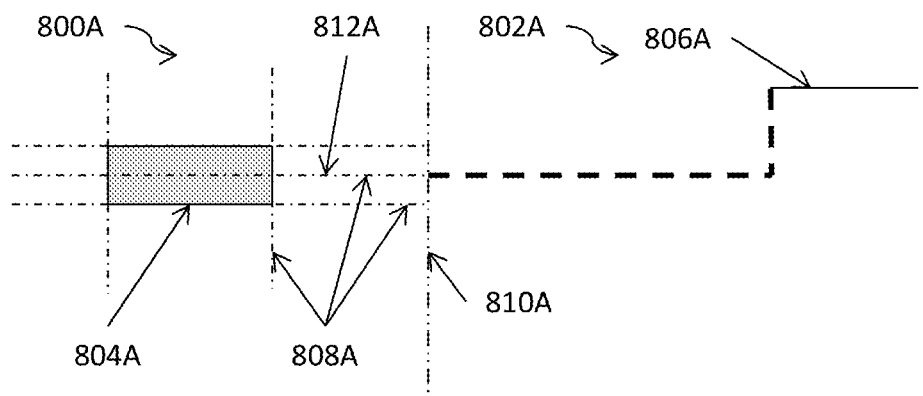
FIGS. 8A-E illustrate some exemplary, physical implementations of a portion of an electronic design with processes or modules described herein in some embodiments.

FIGS. 8A-E illustrate some exemplary, physical implementations of a portion of an electronic design with processes or modules described herein in some embodiments. FIG. 8A illustrates an exemplary configuration on a first layer of an electronic design, including a pin 804A in a region 800A allowing taper rules, and a wire segment or component 806A in a trackless region 802A. 810A represents an imaginary line that separates the taper rule region 800A from the trackless region 802A in this example and does not actually exist in the electronic design. The method or system may invoke the spacetile manipulation module 106 to perform a spacetile punch process for the centerline as well as the boundary of the pin 802A to create the spacetiles 808A. Among spacetiles 808A, the method or system may identify the spacetile 812A as a search probe to perform area based search to find viable routing solutions. The method or system may then route a wire from the centerline of the pin using the search probe 812A, extends the search probe along the search direction (to the right toward 806A in this example) as it continues the search to reach the intersection of 810A and 812A. Assuming bends are allowed in this example, the method or system may then determine the appropriate location for the bend and complete the route to connect to 806A.

Figure 8B:
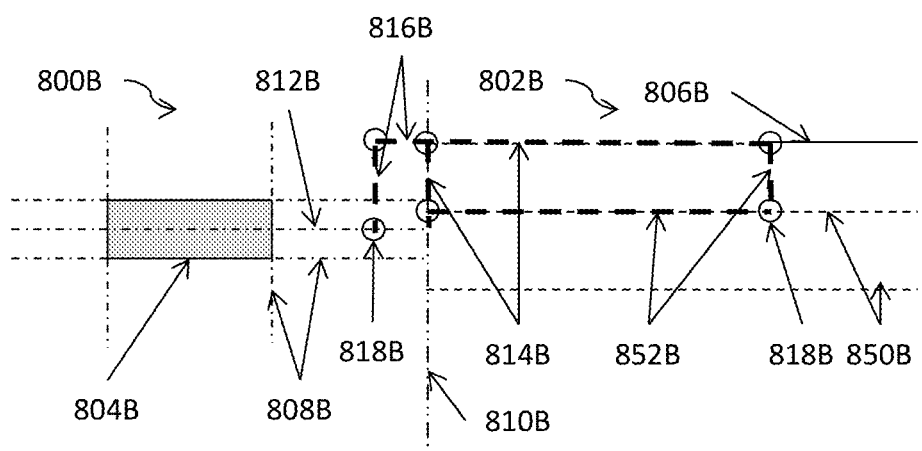

FIG. 8B illustrates another exemplary configuration of a portion of an electronic design include a pin 804B in a trackless region (or a taper rule region allowing one or more taper rules) and a wire segment or a component 806B in a tracked region 802B having an on-track rule and a set of tracks 850B. 810B represents an imaginary line that separates the trackless or taper rule region 800B from the tracked region 802B in this example and does not actually exist in the electronic design. The method or system may invoke the spacetile manipulation module 106 to perform a spacetile punch process for the centerline as well as the boundary of the pin 802B to create the spacetiles 808B. Among spacetiles 808B, the method or system may identify the spacetile 812B as a search probe to perform area based search to find viable routing solutions.

As it can be seen from FIG. 8B, the spacetiles are not aligned with any of the tracks in the tracked region 802B. The method or system may implement the route starting at the pin by using the search probe 812B and continues its search for viable routing solutions toward the tracked region 802B. Assuming wrong-way routing is disallowed in this particular example, the method or system may use the search probe 812B to implement the route and either transition to an immediately neighboring layer before, at, or after the search probe 812B reaches the imaginary line 810B by using a via such as 818B indicating a via for transitioning to an immediately neighboring layer before reaching 810B.

In some embodiments where the method or system continues its search with the search probe 812B past the line 810B, the method or system may expand the search probe 812B along the direction of search or along some other directions if permitted. Route 816B represents the implementation of an interconnect using the search probe 812B and a via 818B to create the interconnect or wire 816B between the pin 804B and the wire or component 806B. Route 814B represents the implementation of an interconnect using the search probe 812B and a via at the junction between trackless region 800B and tracked region 802B to create the interconnect or wire 814B between the pin 804B and the wire or component 806B. Route 852B represents the implementation of an interconnect using the search probe 812B, the spacetile created for the middle track 850B in the tracked region 802B, and a first via along the junction indicated by 8108 and a second via along the spacetile 850B to create the interconnect or wire 852B between the pin 804B and the wire or component 806B. In some other embodiments where bends are allowed on the current layer, the method or system may implement the route without using any of the vias. Rather, the method or system may use one or more bends to implement the route to complete the interconnection.

Figure 8C:
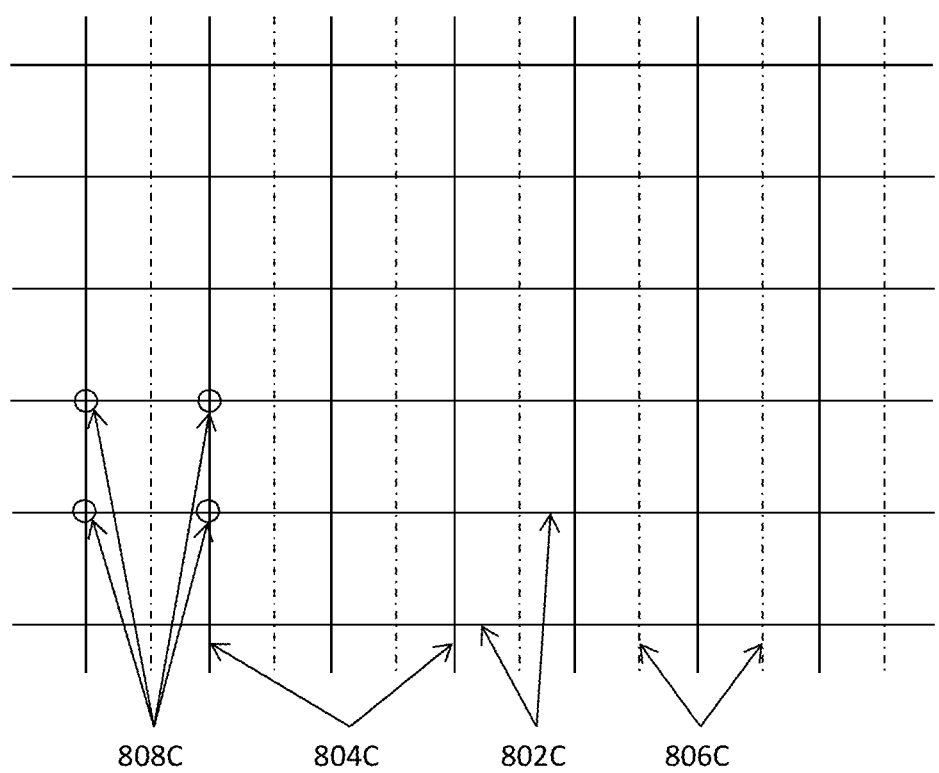

FIG. 8C illustrates another exemplary configuration of a portion of an electronic design where 802C represents tracks on a first layer, and 804D represents tracks on a second, immediately neighboring layer. More specifically, FIG. 8C illustrates the use of soft tracks that are located away from the vias 808C based on, for example, a via cut size rule, a minimum enclosure rule, or a spacing rule, etc. Various methods or systems may use the soft tracks 806C to meet the on-track rule(s) or to reduce or minimize off-track costs for interconnect or wire segments failing to meet the on-track rule(s).

Figure 8D:
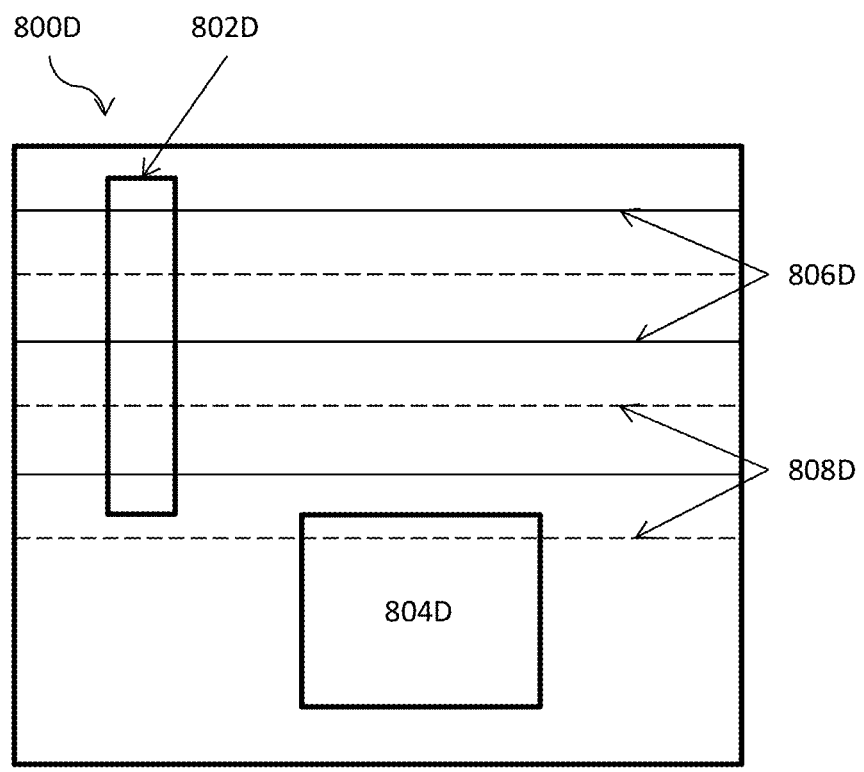

FIG. 8D illustrates another exemplary configuration of a portion or routing region 800D on a second layer and a blockage 804D on the same second layer of an electronic design. FIG. 8D also shows a pin 802D on a first layer. FIG. 8D further shows a first set of 1×-tracks 806D having name "A" for implementing 1×-wires on the second layer (e.g., M2 layer) and a second set of 3×-tracks 808D having name "B" for implementing 3×-wires on the same second layer (e.g., M2 layer). Assuming that this exemplary configuration is subject to the requirements that 1×-wires are to be implemented on tracks with name A, and 3×-wires are to be implemented on tracks with name B. Associating a name with a track or a track pattern is described in greater details in the applications listed in ¶ [0001] that are incorporated by reference for all purposes.

Figure 8E:
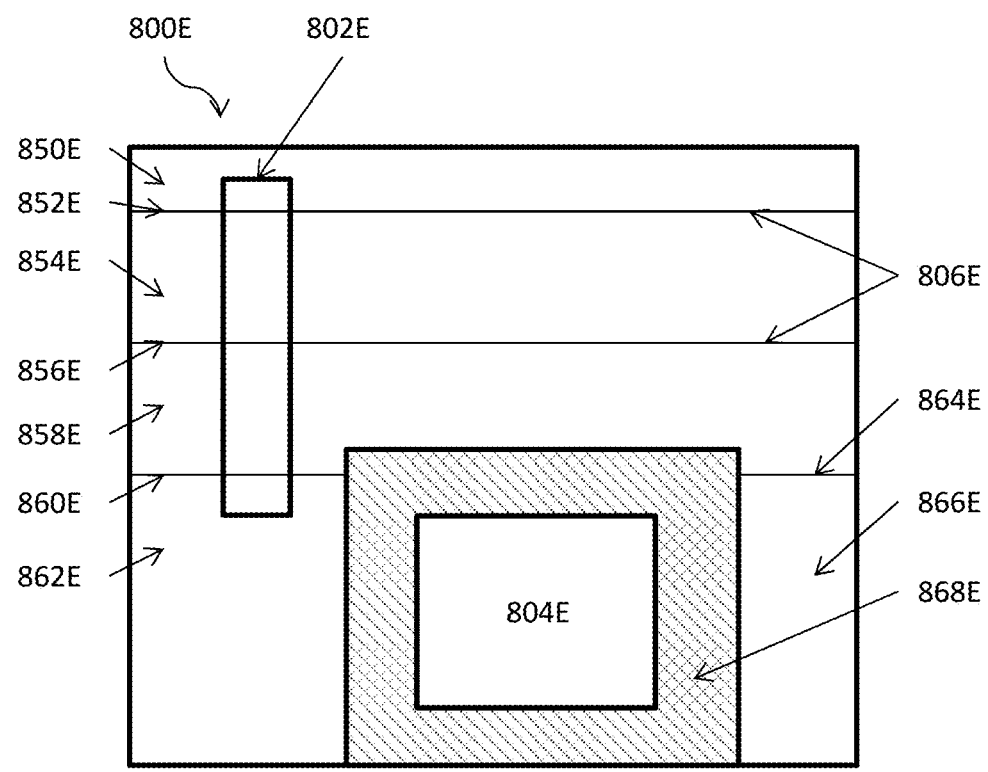

FIG. 8E illustrates effects of the spacetile punch process on the second layer that includes the first set of 1×-tracks and the second set of 3×-tracks illustrated in FIG. 8D. More specifically, the method or system may invoke, for example, the spacetile manipulation module 106 with respect to the first set of 1×-tracks. The blockage 804E is augmented based at least in part on, for example, a minimum spacing rule and half-width of a wire to form an augmented blockage including 804E and the cross-hatched area 868E. In this example, the spacetile punch process divides the routing region or portion 800E into nine one-dimensional degenerated and two-dimensional spacetiles—850E, 852E, 854E, 856E, 858E, 860E, 862E, 864E, and 866E.

It shall be noted that the spacetile punch process for the bottom track of the 1×-tracks creates two one-dimensional degenerated spacetiles —860E and 864E—due to the presence of the augmented blockage area (804E and 868E) on the same second layer. The augmented blockage area prevents the placement of the centerline of a wire in the augmented area and thus breaks up the spacetile for the bottom 1×-track. Of the nine spacetiles, only spacetiles 852E, 856E, 860E, and 864E are on track because they are aligned with some routing tracks, and the other five spacetiles are off track. FIG. 8E illustrates the results or effects of an exemplary spacetile punch process that only punches some of the tracks on a spacetile layer that are being used to implement a portion of the design.

In this example, it is assumed that the implementation (e.g., routing) is to route interconnects with 1×-wires, and thus the method or system invokes, for example, the spacetile manipulation process or module 106 to perform the spacetile punch process with respect to the relevant tracks—1×-tracks 806E in this example. In some other embodiments where 3×-wires or 5×-wires are to be used to implement routing, the method or the system may invoke the spacetile manipulation process or module 106 to perform the spacetile punch process with respect to the 3×-tracks or the 5×-tracks respectively in a substantially similar manner illustrated above.

Figure 9:
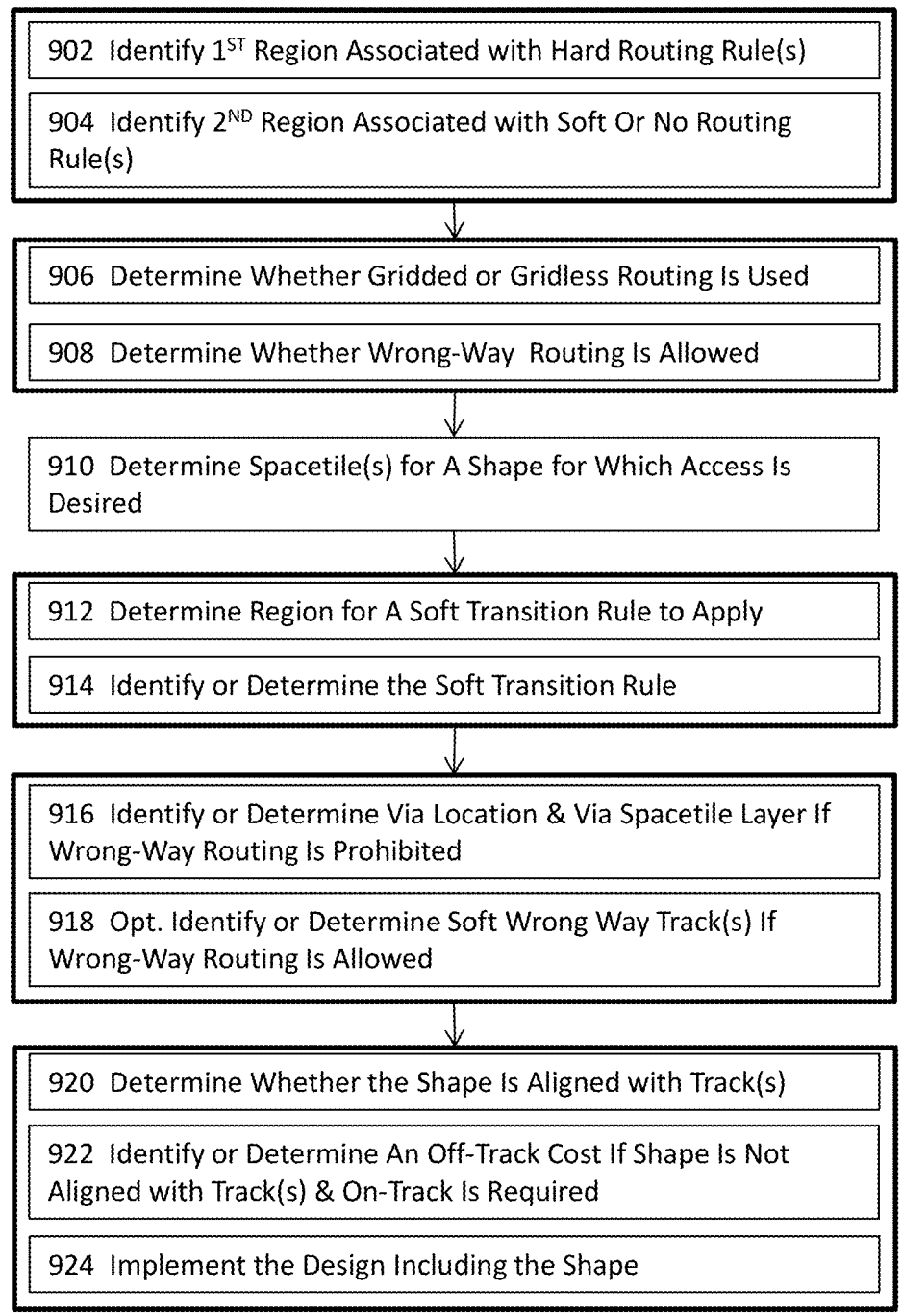
FIG. 9 illustrates a more detailed flow diagram for implementing electronic design using flexible routing tracks in some embodiments.

FIG. 9 illustrates a more detailed flow diagram for implementing electronic design using flexible routing tracks in some embodiments. More specifically, FIG. 9 illustrates the incorporation of both hard rules and soft rules to provide even further flexibility in electronic design implementations because off-track circuit features (e.g., pins, terminals, pads, etc.) may exist or because certain spacing design rules (e.g., a minimum spacing rule or parallel run-length rule) may push an object over a fraction of a track width. Some embodiments treat all the rules on a metal layer as hard rules, while some other embodiments treat all the rules on a metal layer as soft rules. Some embodiments may perform their intended functions while allowing commingled soft rules and hard rules on the same layer or even in the same region of a layer.

In these embodiments, the method or system may include the respective process or module 902 for identifying a first layer or first region that is associated with one or more hard rules. A hard rule include a constraint or a requirement that must be satisfied in some of these embodiments. In some of these embodiments, each layer is associated with a single rule. In other embodiments, a layer may be associated with more than one rule. In some embodiments, a rule may include a routing rules that is used to guide a router to perform physical routing such as global routing, channel-routing, conduit routing, or detail routing for at least a portion of the electronic design, a rule requiring certain wires to be on track in a certain region of a layer or on a certain layer, a width requirement for certain wires or certain tracks (e.g., a first wire is to have 3×-width, a first track is to be used to route a wire having a 5×-width), a rule indicating a first track pattern or certain tracks are to be used to implement wires of certain width(s), one or more on-track requirements, whether or not taper rules are permitted or allowed, width requirement(s), etc.

In some embodiments, the method or system may include the respective process or module 904 for identifying a second layer or a second region associated with one or more soft rules or no rules at all. In some embodiments where processes or modules 902 and 904 identify a first region and a second region respectively, the first region and the second region may reside on the same routing layer or on different routing layers. A soft rule includes a constraint or a requirement that is desired to be but need not necessarily be satisfied such that a violation of a soft rule does not cause, for example, a design rule checking error.

In some embodiments, the method or system may include the respective process or module 906 for determining whether or not the gridded or the gridless routing methodology is used or to be used to implement at least a part of an electronic design. In some of these embodiments, the method or the system may consider all the rules as hard rules where the method or system determines that the gridded routing methodology is used or to be used to implement at least a part of an electronic design. In some embodiments, the method or system may include the respective process or module 908 for determining whether both right-way routing and wrong-way routing are allowed on a layer or a portion of the layer of the electronic design. In some embodiments where both right-way routing and wrong-way routing are allowed on a layer or a portion of the layer of the electronic design, the router may include one or more bends for an interconnect or wire segment, without resorting to the use of vias to accommodate the wrong-way routing.

In some embodiments, the method or system may include the respective process or module 910 for determining or identifying one or more spacetiles for a shape for which access is desired. For example, the process or module 910 may identify one or more spacetiles for accessing a pin, a terminal, a pad, or a location of a net in the at least a part of the electronic design. In some embodiments where one or more taper rules are allowed, the process or module 910 may invoke, for example, the spacetile manipulation module 106 to perform a spacetile punch process to create the one or more spacetiles for the shape in substantially similar manners as those described previously.

These one or more spacetiles can be incorporated into a via spacetile layer (if existing), regardless of whether or not the shape is aligned with certain tracks. In some of these embodiments, the one or more taper rules are treated as trackless, regardless of whether or not the layer of interest or the region of interest is tracked or trackless. In some other embodiments, a taper rule may be considered as a soft rule. A trackless region or layer contains no tracks, whereas a gridded region or layer, although having no grids, may have tracks in a first routing direction but not in both the first routing direction and the second routing direction.

In some embodiments, the method or system may include the respective process or module 912 for identifying or determining a region for the one or more soft rules to apply. In some of these embodiments, the region comprises an area in the electronic design for transitioning from one rule to another rule. For example, the process or module 912 may identify or determine an area in an electronic design to guide the router to transition from a first region where a wire fails to meet the on-track requirement to a second region associated with a second rule requiring wires be on track. In some embodiments, the method or system may include the respective process or module 914 for determining or identifying a soft transition rule for the region identified or determined at 912 to apply.

The identification or determination of the soft transition rule depends on what rules apply (e.g., on-track rules, width rules, etc.), the topology of the region of interest of the electronic design (e.g., whether the region of interest is trackless, gridless, tracked, gridded, etc.) in some embodiments. In some embodiments, the identification or determination of a soft transition rule may also work in conjunction with the process or module 922 or the process or module 108 to associate a cost with the soft transition rule. In addition or in the alternative, the process or module 914 may identify or determine a soft transition rule based at least in part upon the one or more soft rules identified at 904.

In some of these embodiments, the process or module 914 may examine the one or more soft rules and identify a soft rule from the one or more soft rules as the soft transition rule. In some other embodiments, the process or module 914 may examine the one or more soft rules and identify or determine, either alone or in conjunction with other processes or modules such as the cost mechanism, a soft transition rule by leveraging at least one of the one or more soft rules. For example, if a soft rule prefers a route having 3×-width yet permits the route to have 1×-width in a certain region, the process or module 914 may leverage this soft rule in its determination or identification of the soft transition rule to guide the router to transition from 3×-tracks to 1×-tracks.

In some embodiments, the method or system may include the respective process or module 916 for identifying or determining a via spacetile layer. In addition, the process or module 916 may further identify or determine one or more via locations by, for example, identifying the intersections between spacetiles from two immediately neighboring spacetile layers. In some of these embodiments, the process or module 916 may identify or determine the one or more via locations based at least upon one or more rules such as a via cut size rule, a minimum enclosure rule, a minimum spacing rule, etc. In these embodiments, wrong-way routing is disallowed, although one or more bends may be required to implement an interconnect or wire between two locations. In some embodiments, the method or system may optionally include the respective process or module 918 for identifying or determining soft wrong-way tracks where wrong-way routing is allowed.

In some embodiments, the method or system may include the respective process or module 920 for determining whether the shape or a part thereof is aligned with one or more tracks. For example, the process or module 920 may determine whether a centerline of the shape in a first direction or a part of the boundary is aligned with some tracks. In some embodiments, the method or system may include the respective process or module 922 for identifying or determining an off-track cost for a wire or interconnect segment that fails to meet the on-track requirement. In some embodiments, the process or module 922 may determine or identify the same cost for cost for a wire or interconnect segment that fails to meet the on-track requirement, regardless of whether or not the on-track requirement is a hard rule or a soft rule. In some other embodiments, the process or module 922 may identify or determine a first constant, linear, or non-linear cost for a wire segment failing to meet a hard on-track rule and a second constant, linear, or non-linear cost for a wire segment failing to meet a soft on-track rule. In various embodiments the costs may be constant or may be linearly or non-linearly proportional to the length of the wire or interconnect segment in violation of the on-track rule.

In some embodiments, the method or system may include the respective process or module 924 for implementing the at least a portion of the electronic design including the shape. In some the aforementioned embodiments for FIG. 9, the method or system may implement a route from a gridless or trackless region to a tracked or gridded region on the same layer or on different layers by devising and using the soft transitioning rule and the transition region.

In addition, various embodiments, the method or system may determine or identify the transition region in which the soft transition rule applies based at least in part upon one or more criteria including the cost for implementing a circuit feature in a layout using the soft transition rule, the extensiveness of using the soft transition rule in implementing a circuit feature (e.g., the length of a wire implemented by using the soft transition rule, while the associated cost is linearly or non-linearly proportional to the length of the wire), the space of the first region, the space of the second region, whether or not bends are allowed in implementing a wire or interconnect, one or more design rules (e.g., via cut size rule, via enclosure rule, or spacing rule, etc.), the amount of space required or desired for transition, one or more performance requirements (e.g., the cross-talk requirement, or the speed requirement, etc.), one or more neighboring circuit components having certain space or spacing requirement(s), the context in which the circuit feature being implemented resides, one or more attributes or characteristics of one or more neighboring layers (e.g., tracks or track patterns in one or more neighboring layers, circuit components in one or more neighboring layers, or impact of transition on performances or implementations of one or more neighboring layers, etc.)

For example, assuming that in the exemplary configuration illustrated in FIG. 8B, the region 800B is tracked where the shape 804B is not aligned with any tracks in the region 800B, and the region 802B is also tracked with a different set of tracks or a different track pattern, the method or the system may examine, for example, the cost for going off-track in the region 800B and the cost for going off-track in the region 802B to determine where to place the via 818B. For example, if the cost for going off-track in the region 800B is higher than that for going off-track in the region 802B, the method or the system may identify or determine the transition region accordingly so as to shorten the interconnect in region 800B and thus reduce the cost for having an interconnect segment off-track in this region. As another example, the method or the system may also examine the designs in an immediately neighboring layer and determine that the region in the immediately neighboring layer corresponding to region 800B is less favorable to accommodate a via (assuming bends are not allowed) due to, for example, the via cut size rule, the via enclosure rule or both, the method or system may determine or identify the transition region and the transition rule in such a way that the transition region extends into region 802B to accommodate a via in that region.

System Architecture Overview

Figure 10:
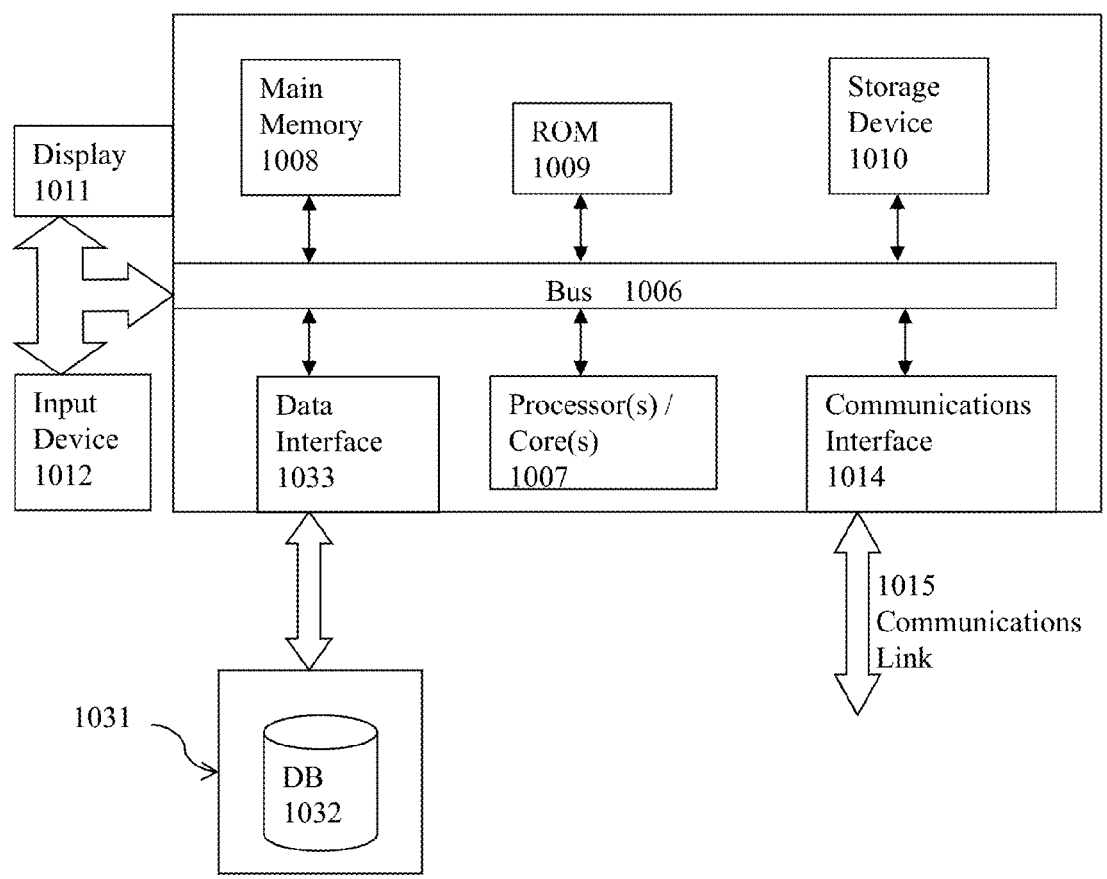
FIG. 10 illustrates a computerized system on which a method for implementing electronic design using flexible routing tracks may be implemented.

FIG. 10 illustrates a block diagram of an illustrative computing system 1000 suitable for implementing analog behavioral modeling and IP (intellectual property) integration using SystemVerilog Hardware Description Language (HDL) as described in the preceding paragraphs with reference to various figures. Computer system 1000 includes a bus 1006 or other communication mechanism for communicating information, which interconnects subsystems and devices, such as processor 1007, system memory 1008 (e.g., RAM), static storage device 1009 (e.g., ROM), disk drive 1010 (e.g., magnetic or optical), communication interface 1014 (e.g., modem or Ethernet card), display 1011 (e.g., CRT or LCD), input device 1012 (e.g., keyboard), and cursor control (not shown).

According to one embodiment, computer system 1000 performs specific operations by one or more processor or processor cores 1007 executing one or more sequences of one or more instructions contained in system memory 1008. Such instructions may be read into system memory 1008 from another computer readable/usable storage medium, such as static storage device 1009 or disk drive 1010. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 1007, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any medium that participates in providing instructions to processor 1007 for execution. Such a medium may take many forms, including but not limited to, non-volatile media and volatile media. Non-volatile media includes, for example, optical or magnetic disks, such as disk drive 1010. Volatile media includes dynamic memory, such as system memory 1008.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1000. According to other embodiments of the invention, two or more computer systems 1000 coupled by communication link 1015 (e.g., LAN, PTSN, or wireless network) may perform the sequence of instructions required to practice the invention in coordination with one another.

Computer system 1000 may transmit and receive messages, data, and instructions, including program, i.e., application code, through communication link 1015 and communication interface 1014. Received program code may be executed by processor 1007 as it is received, and/or stored in disk drive 1010, or other non-volatile storage for later execution. In an embodiment, the computer system 1000 operates in conjunction with a data storage system 1031, e.g., a data storage system 1031 that contains a database 1032 that is readily accessible by the computer system 1000. The computer system 1000 communicates with the data storage system 1031 through a data interface 1033. A data interface 1033, which is coupled to the bus 1006, transmits and receives electrical, electromagnetic or optical signals that include data streams representing various types of signal information, e.g., instructions, messages and data. In embodiments of the invention, the functions of the data interface 1033 may be performed by the communication interface 1014.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

I claim:

1. A computer implemented method for implementing electronic design using flexible routing tracks, comprising:
   identifying, with a track pattern manipulation mechanism including or functioning in conjunction with at least one processor or at least one processor core of a computing system, a track pattern having multiple tracks and associated with a first routing rule for implementing at least a part of a net including a shape in a first region on a first layer, wherein the shape is associated with a first rule;
   identifying or creating one or more spacetiles based at least in part upon the shape; and
   implementing the at least a part of the net including the shape by using at least one spacetile of the one or more spacetiles as a search probe for implementation of the at least part of the net, wherein the at least one spacetile overlaps in part or in whole with at least the shape.

2. The computer implemented method of claim 1, the process further comprising:
   identifying the net including the shape and the first rule; and
   identifying the first routing rule associated with the multiple tracks.

3. The computer implemented method of claim 1, the process further comprising:
   determining whether or not wrong-way tracks are to be used in implementing the at least a part of the net including the shape; and
   identifying a spacetile as an area-based search probe from the one or more spacetiles, wherein the act of implementing the at least a part of the net is performed by further using the area-based search probe.

4. The computer implemented method of claim 3, the process further comprising:

identifying or creating a via spacetile layer for the first layer and a second layer immediately neighboring the first layer, wherein
the wrong-way tracks are disallowed in implementing the at least a part of the net including the shape; and
identifying the one or more spacetiles for the via spacetile layer by using at least one or more geometric components of the shape.

5. The computer implemented method of claim 4, the act of identifying the one or more spacetiles for the via spacetile layer comprising:
performing a spacetile punch process for the at least one or more geometric components of the shape to create a first set of spacetiles;
identifying a second set of zero or more spacetiles from the second layer;
aggregating the first set of spacetiles and the second set of zero or more spacetiles to form the one or more spacetiles; and
incorporating the one or more spacetiles into the via spacetile layer at corresponding locations.

6. The computer implemented method of claim 4, wherein the one or more geometric components include at least one of a centerline of the shape in a first direction and a boundary segment of the shape in the first direction.

7. The computer implemented method of claim 1, the process further comprising:
identifying multiple routing rules for implementing the at least a part of the net;
identifying one or more corresponding tracks for each routing rule of the multiple routing rules;
associating a respective spacetile layer with the each routing rule of the multiple routing rules; and
associating the respective spacetile layer with the one or more corresponding tracks identified for the each routing rule.

8. The computer implemented method of claim 1, the process further comprising:
determining a relation between the shape or a geometric component of the shape and at least one track of the multiple tracks.

9. The computer implemented method of claim 8, wherein the relation indicates whether or not the shape or the geometric component of the shape is aligned with the at least one track of the multiple tracks.

10. The computer implemented method of claim 8, the process further comprising:
determining whether wrong-way tracks are to be used to implement the at least a part of the net;
identifying a spacetile as a search probe from the one or more spacetiles; and
performing an area-based search for implementation solutions by using at least the search probe, wherein the act of implementing the at least a part of the net is performed by further using at least some of the implementation solutions.

11. The computer implemented method of claim 10, the process further comprising:
identifying a first spacetile layer for at least the first layer;
identifying a second spacetile layer for a second layer;
identifying or creating a via spacetile layer for the first layer and a second layer immediately neighboring the first layer, wherein no wrong-way tracks are permitted in implementing the at least a part of the net; and
aggregate the one or more spacetiles into the via spacetile layer from both the first spacetile layer and the second spacetile layer.

12. The computer implemented method of claim 8, the process further comprising:
determining whether or not a taper rule is allowed in implementing the at least a part of the net;
determining whether wrong-way tracks are to be used to implement the at least a part of the net; and
identifying or determining the taper rule to reconcile the first routing rule and the first rule, wherein the relation indicates a conflict between the first rule and the first routing rule.

13. The computer implemented method of claim 12, the process further comprising:
identifying or determining a first spacetile layer for the first rule;
identifying or determining a second spacetile layer for the first routing rule;
identifying or determining a via spacetile layer for the first spacetile layer and the second spacetile layer; and
aggregating the one or more spacetiles from the first spacetile layer and the second spacetile layer into the via spacetile layer.

14. The computer implemented method of claim 12, the process further comprising:
determining whether or not a taper rule is allowed in implementing the at least a part of the net;
determining whether wrong-way tracks are to be used to implement the at least a part of the net;
identifying or determining a cost mechanism; and
associating a cost with a physical implementation, which violates the first rule or the first routing rule, of the at least a part of the net.

15. The computer implemented method of claim 14, the process further comprising:
identifying or determining a first spacetile layer for the first rule;
identifying or determining a second spacetile layer for the first routing rule;
identifying or determining a via spacetile layer for the first spacetile layer and the second spacetile layer; and
aggregating the one or more spacetiles from the first spacetile layer and the second spacetile layer into the via spacetile layer.

16. The computer implemented method of claim 14, the process further comprising:
marking the at least a spacetile as satisfying the first routing rule, wherein the at least a spacetile is determined not to satisfy the first routing rule.

17. The computer implemented method of claim 1, the process further comprising:
identifying or determining a soft transition rule for transition between a first portion of an electronic design associated with one or more hard rules; and
identifying or determining a second portion of the electronic design associated with one or more soft rules or no rules at all in the electronic design.

18. The computer implemented method of claim 17, the process further comprising:
identifying or determining a transition region to which the soft transition rule applies, wherein the soft transition region is associated with the first portion and the second portion; and
implementing at least a portion of the net including the shape in both the first portion and the second portion by using at least the transition region.

19. The computer implemented method of claim 17, the process further comprising at least one of:

determining whether gridded, gridless, tracked, or trackless routing methodology is used to implement the at least a part of the first portion and the second portion;

determining whether or not wrong-way routing is permitted in implementing the at least the part of the first portion and the second portion; and determining a via spacetile layer.

20. The computer implemented method of claim 19, the act of determining the via spacetile layer comprising:

performing a spacetile punch process for the first region to create a first set of one or more spacetiles;

identifying a second set of zero or more spacetiles from the second portion;

aggregating the first set of spacetiles and the second set of zero or more spacetiles to form one or more spacetiles; and incorporating the one or more spacetiles into the via spacetile layer at corresponding locations.

21. The computer implemented method of claim 17, the process further comprising at least one of:

determining whether or not an object for which interconnection is desired is aligned with a track to satisfy at least one rule of the one or more hard rules and the one or more soft rules; and identifying or determining a cost for a physical implementation failing to satisfy one of the one or more soft rules.

22. A system for implementing electronic design using flexible routing tracks, comprising:

a computing system having at least one processor or at least one processor core that is to:

identify, with a track pattern manipulation mechanism including or functioning in conjunction with at least one processor or at least one processor core of a computing system, a track pattern having multiple tracks and associated with a first routing rule for implementing at least a part of a net including a shape in a first region on a first layer, wherein the shape is associated with a first rule;

identify or create one or more spacetiles based at least in part upon the shape; and implement the at least a part of the net including the shape by using at least a spacetile of the one or more spacetiles as a search probe for implementation of the at least part of the net, wherein the at least one spacetile overlaps in part or in whole with at least the shape.

23. The system of claim 22, wherein the at least one processor or at least one processor core is further to:

determine whether or not wrong-way tracks are to be used in implementing the at least a part of the net including the shape; and identify a spacetile as an area-based search probe from the one or more spacetiles, wherein the act of implementing the at least a part of the net is performed by further using the area-based search probe.

24. The system of claim 23, wherein the at least one processor or at least one processor core is further to:

identify or creating a via spacetile layer for the first layer and a second layer immediately neighboring the first layer, wherein the wrong-way tracks are disallowed in implementing the at least a part of the net including the shape; and identify the one or more spacetiles for the via spacetile layer by using at least one or more geometric components of the shape.

25. The system of claim 24, wherein the at least one processor or the at least one processor core is further to:

perform a spacetile punch process for the at least one or more geometric components of the shape to create a first set of spacetiles;

identify a second set of zero or more spacetiles from the second layer;

aggregate the first set of spacetiles and the second set of zero or more spacetiles to form the one or more spacetiles; and incorporate the one or more spacetiles into the via spacetile layer at corresponding locations.

26. An article of manufacture comprising a non-transitory computer accessible storage medium having stored thereupon a sequence of instructions which, when executed by at least one processor or at least one processor core executing one or more threads, causes the at least one processor or the at least one processor core to perform a method for implementing electronic design using flexible routing tracks, the method comprising:

identifying with a track pattern manipulation mechanism including or functioning in conjunction with at least one processor or at least one processor core of a computing system, a track pattern having multiple tracks and associated with a first routing rule for implementing at least a part of a net including a shape in a first region on a first layer, wherein the shape is associated with a first rule;

identifying or creating one or more spacetiles based at least in part upon the shape; and implementing the at least a part of the net including the shape by using at least a spacetile of the one or more spacetiles as a search probe for implementation of the at least part of the net, wherein the at least one spacetile overlaps in part or in whole with at least the shape.

27. The article of manufacture of claim 26, the process further comprising:

determining a relation between the shape or a geometric component of the shape and at least one track of the multiple tracks, wherein the relation indicates whether or not the shape or the geometric component of the shape is aligned with the at least one track of the multiple tracks.

28. The article of manufacture of claim 27, the process further comprising:

determining whether wrong-way tracks are to be used to implement the at least a part of the net;

identifying a spacetile as a search probe from the one or more spacetiles; and performing an area-based search for implementation solutions by using at least the search probe, wherein the act of implementing the at least a part of the net is performed by further using at least some of the implementation solutions.

29. The article of manufacture of claim 27, the process further comprising:

determine whether or not a taper rule is allowed in implementing the at least a part of the net;

determine whether wrong-way tracks are to be used to implement the at least a part of the net; and identify or determine the taper rule to reconcile the first routing rule and the first rule, wherein the relation indicates a conflict between the first rule and the first routing rule.

30. The article of manufacture of claim 27, the process further comprising:

determine whether or not a taper rule is allowed in implementing the at least a part of the net;

determine whether wrong-way tracks are to be used to implement the at least a part of the net;

identify or determine a cost mechanism; and associate a cost with a physical implementation, which violates the first rule or the first routing rule, of the at least a part of the net.

* * * * *